US011176885B2

(12) United States Patent
Toyomura et al.

(10) Patent No.: US 11,176,885 B2
(45) Date of Patent: Nov. 16, 2021

(54) DISPLAY DEVICE, METHOD FOR DRIVING DISPLAY DEVICE, AND ELECTRONIC DEVICE

(71) Applicant: Sony Group Corporation, Tokyo (JP)

(72) Inventors: Naobumi Toyomura, Kanagawa (JP); Katsuhide Uchino, Kanagawa (JP); Yuki Seo, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 653 days.

(21) Appl. No.: 15/519,987

(22) PCT Filed: Aug. 31, 2015

(86) PCT No.: PCT/JP2015/074705
§ 371 (c)(1),
(2) Date: Apr. 18, 2017

(87) PCT Pub. No.: WO2016/072140
PCT Pub. Date: May 12, 2016

(65) Prior Publication Data
US 2017/0337874 A1 Nov. 23, 2017

(30) Foreign Application Priority Data
Nov. 4, 2014 (JP) .............................. JP2014-224095

(51) Int. Cl.
*G09G 3/3258* (2016.01)
*G09G 3/30* (2006.01)
(Continued)

(52) U.S. Cl.
CPC ............. *G09G 3/3258* (2013.01); *G09G 3/20* (2013.01); *G09G 3/30* (2013.01); *G09G 3/3233* (2013.01);
(Continued)

(58) Field of Classification Search
CPC ............... G09G 3/3258; G09G 3/3266; G09G 2300/0426; G09G 2300/0452;
(Continued)

(56) References Cited

U.S. PATENT DOCUMENTS 9,653,020 B2 * 5/2017 Uchino ................ G09G 3/3233
2007/0115224 A1 * 5/2007 Yamamoto ........... G09G 3/3233
345/76
(Continued)

FOREIGN PATENT DOCUMENTS

JP 2008-203658 A 9/2008
JP 2009-282192 A 12/2009
(Continued)

OTHER PUBLICATIONS

English Translation of JP 2008-203658.*
English Translation of JP 2009-282192.*
English Translation of JP 2012-242772.*

*Primary Examiner* — Patrick N Edouard
*Assistant Examiner* — Eboni N Giles
(74) *Attorney, Agent, or Firm* — Michael Best & Friedrich LLP

(57) ABSTRACT

A display device includes a pixel array unit in which pixel circuits are disposed in a matrix form, the pixel circuits each including a light emission unit, a write transistor that writes a signal voltage of a video signal, a retention capacitor that retains the signal voltage written by the write transistor, and a drive transistor that drives the light emission unit on the basis of the signal voltage retained by the retention capacitor; and a common line that is wired along a pixel row, for each pixel row. The pixel circuit includes a switching transistor which selectively connects the common line and a source electrode of the drive transistor.

16 Claims, 12 Drawing Sheets

(51) Int. Cl.
*G09G 3/20* (2006.01)
*G09G 3/3233* (2016.01)
*G09G 3/3266* (2016.01)
*H01L 27/32* (2006.01)
*H01L 27/12* (2006.01)

(52) U.S. Cl.
CPC ....... *G09G 3/3266* (2013.01); *H01L 27/3276* (2013.01); *G09G 2300/0426* (2013.01); *G09G 2300/0452* (2013.01); *G09G 2300/0819* (2013.01); *G09G 2300/0842* (2013.01); *G09G 2300/0866* (2013.01); *G09G 2310/0251* (2013.01); *G09G 2310/0286* (2013.01); *G09G 2310/0289* (2013.01); *G09G 2310/061* (2013.01); *G09G 2310/08* (2013.01); *G09G 2320/0233* (2013.01); *G09G 2320/045* (2013.01); *G09G 2320/064* (2013.01); *G09G 2330/02* (2013.01); *H01L 27/124* (2013.01); *H01L 27/1255* (2013.01); *H01L 27/3213* (2013.01); *H01L 27/3262* (2013.01); *H01L 27/3265* (2013.01)

(58) Field of Classification Search
CPC ... G09G 2300/0819; G09G 2310/0286; G09G 2310/0289; G09G 2310/061; G09G 2310/08; G09G 2320/0233; G09G 2320/045; G09G 2320/064; G09G 2330/02; H01L 27/3276; H01L 27/124; H01L 27/1255; H01L 27/3213; H01L 27/3262; H01L 27/3265
See application file for complete search history.

(56) References Cited

U.S. PATENT DOCUMENTS

| | | | |
|---|---|---|---|
| 2008/0231560 A1* | 9/2008 | Yamashita | G09G 3/3266 345/76 |
| 2009/0179831 A1* | 7/2009 | Yamashita | G09G 3/3233 345/76 |
| 2009/0251493 A1* | 10/2009 | Uchino | G09G 3/3291 345/690 |
| 2010/0309174 A1* | 12/2010 | Tomida | G09G 3/3233 345/204 |
| 2011/0148949 A1* | 6/2011 | Matsui | G09G 3/3233 345/690 |

FOREIGN PATENT DOCUMENTS

| | | |
|---|---|---|
| JP | 2012-242772 A | 12/2012 |
| JP | 2012-255875 A | 12/2012 |
| JP | 2012-255876 A1 | 12/2012 |
| WO | 2014/103500 A1 | 7/2014 |

* cited by examiner

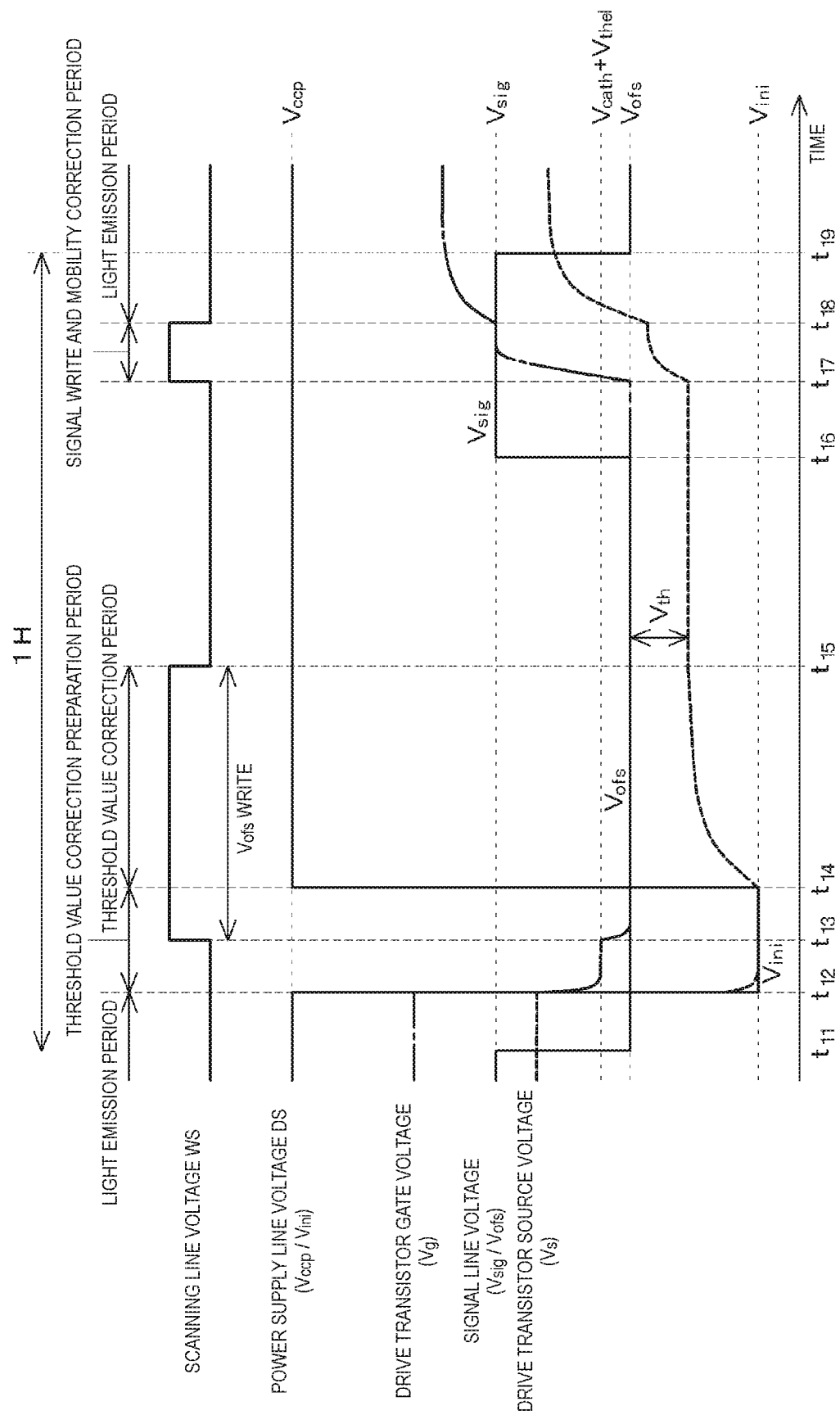

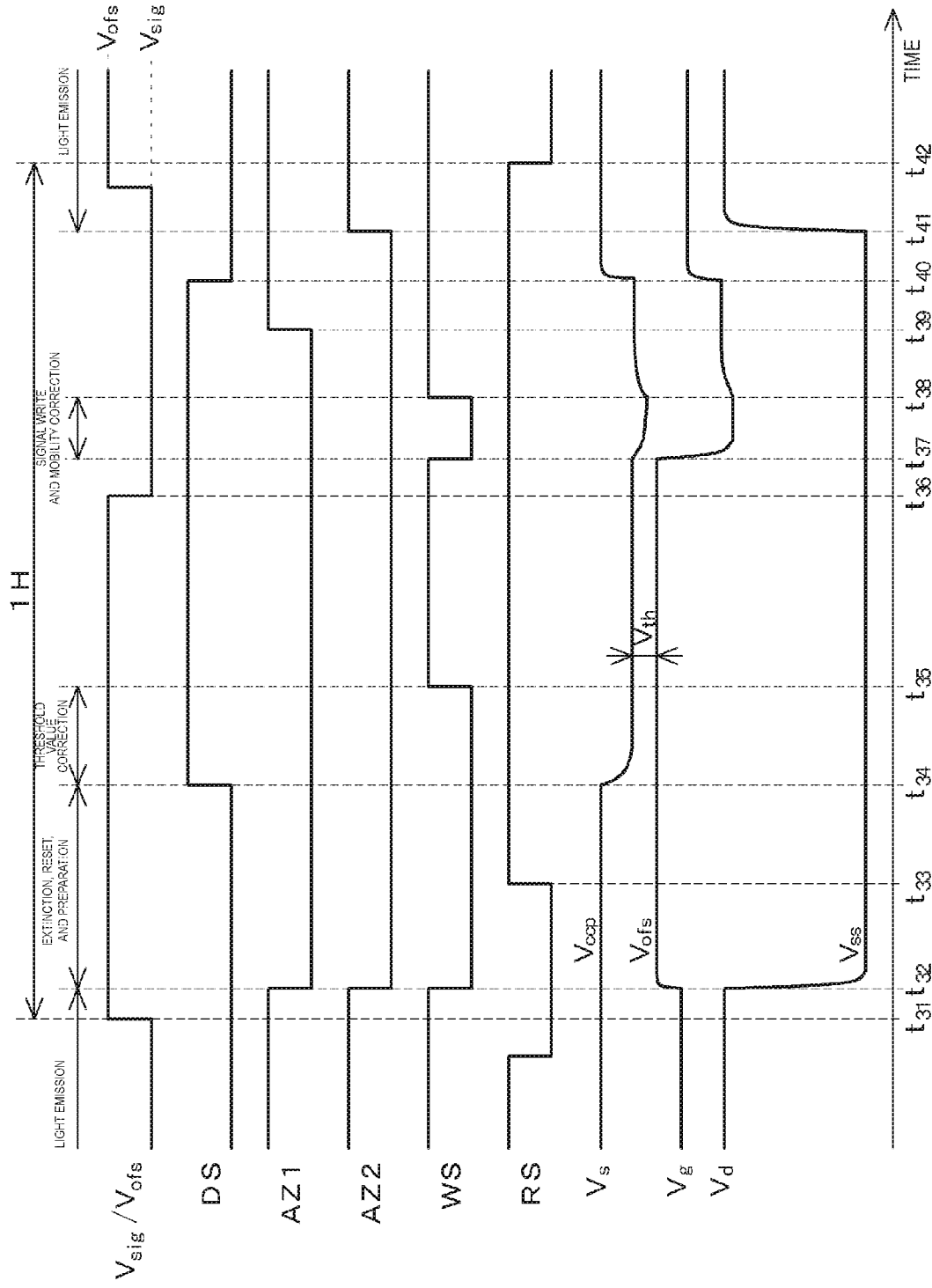

DISPLAY DEVICE, METHOD FOR DRIVING DISPLAY DEVICE, AND ELECTRONIC DEVICE

TECHNICAL FIELD

The present disclosure relates to a display device, a method for driving the display device, and an electronic device.

BACKGROUND ART

Recently, in the field of display devices, a flat panel type display device in which pixels (pixel circuits) including light emission units are 2-dimensionally disposed in a matrix form has become mainstream. In such a flat panel type display device, a characteristic of a transistor that drives a light emission unit may vary for each pixel due to a change in a process or the like. The characteristic variation of the transistor that drives the light emission unit affects light emitting luminance.

Specifically, even if a video signal of the same level (signal voltage) is written into each pixel, the light emitting luminance varies between pixels. Thus, display unevenness occurs, and then uniformity of a display screen deteriorates. Accordingly, a function for correcting the display unevenness due to the characteristic variation of the transistor that drives the light emission unit or the like is provided in the display device. Further, the correction operation is performed during a period in which a write transistor that writes a video signal is in a conductive state. The correction period in which the correction operation is performed is determined by a capacitance value of a pixel capacitor (capacity pixel).

However, in display devices having the above-described correction function, there are cases in which it is necessary to shorten a correction period (correction time) as a source voltage of the drive transistor varies during the correction operation. The correction period is determined by a pulse width of a drive pulse that drives the write transistor. Accordingly, it is possible to shorten the correction period by shortening the pulse width of the drive pulse. Thus, in the related art, a pulse width adjustment circuit is formed on a display panel to generate a pulse signal of which a pulse width is shortened on the basis of a pulse signal input from the outside, and the pulse signal is used as the drive pulse (for example, see PTL 1).

CITATION LIST

Patent Literature

Patent Literature 1: JP 2012-255875A

SUMMARY OF INVENTION

Technical Problem

However, according to the related art technology disclosed in PTL 1, since it is necessary for the pulse width adjustment circuit that generates the drive pulse of which the pulse width is shortened to be formed on the display panel, a circuit size of peripheral circuits that drive the pixel circuit increases. As a result, since the area of a peripheral circuit region of a pixel array unit on the display panel on which the peripheral circuits are disposed, that is, a so-called frame region, is increased, which hinders miniaturization of the display panel.

The present disclosure aims to provide a display device in which a pulse width of a drive pulse does not need to be shortened and in which a circuit size of peripheral circuits of a pixel array is enabled to be reduced, a method for driving the display device, and an electronic device including the display device.

Solution to Problem

To achieve the above described aim, a display device according to the present disclosure includes:

a pixel array unit in which pixel circuits are disposed in a matrix form, the pixel circuits each including a light emission unit, a write transistor that writes a signal voltage of a video signal, a retention capacitor that retains the signal voltage written by the write transistor, and a drive transistor that drives the light emission unit on the basis of the signal voltage retained by the retention capacitor; and a common line that is wired along a pixel row, for each pixel row.

The pixel circuit includes a switching transistor which selectively connects the common line and a source electrode of the drive transistor.

In addition, to achieve the above described aim, an electronic apparatus according to the present disclosure includes the display device having the above described configuration.

To achieve the above described aim, a method for driving a display device according to the present disclosure includes:

a pixel array unit in which pixel circuits are disposed in a matrix form, the pixel circuits each including a light emission unit, a write transistor that writes a signal voltage of a video signal, a retention capacitor that retains the signal voltage written by the write transistor, and a drive transistor that drives the light emission unit on the basis of the signal voltage retained by the retention capacitor; and a common line that is wired along a pixel row, for each pixel row.

In the pixel circuit including a switching transistor which selectively connects the common line and a source electrode of the drive transistor, a capacitance value of a pixel capacitor increases as the switching transistor enters a conductive state.

In the display device, the method for driving the display device and the electronic device having the above-described configurations, a parasitic capacitor having a capacitance value larger than that of the pixel capacitor of each of pixel circuits is present in the common line wired along the pixel row. Accordingly, since the parasitic capacitor of the common line is added to the source electrode of the drive transistor as the switching transistor enters a conductive state, the capacitance value of the pixel capacitor increases. Further, as the capacitance value of the pixel capacitor increases, it is possible to shorten a correction period determined by the capacitance value.

Advantageous Effects of Invention

According to the present disclosure, by increasing a capacitance value of a pixel capacitor, it is not necessary to shorten a pulse width of a drive pulse, and thus it is possible to reduce a circuit size of peripheral circuits of a pixel array.

Note that the present disclosure is not limited to exhibiting the effect described herein at all and may exhibit any effect described in the present specification. In addition, the effects described in the present specification are not limiting but are merely examples, and there may be additional effects.

BRIEF DESCRIPTION OF DRAWINGS

FIG. 3 is a timing waveform diagram for describing a basic circuit operation in an ideal state of the active-matrix organic EL display device which is the premise of the present disclosure.

FIG. 4 is a waveform diagram illustrating a mobility correction operation, in which

FIG. 10 is a timing waveform diagram for illustrating a circuit operation of the organic EL display device including the pixel circuits according to Example 2.

FIG. 11 is an external view of a lens interchangeable single lens reflex type digital camera, in which

MODE(S) FOR CARRYING OUT THE INVENTION

Figure 1:
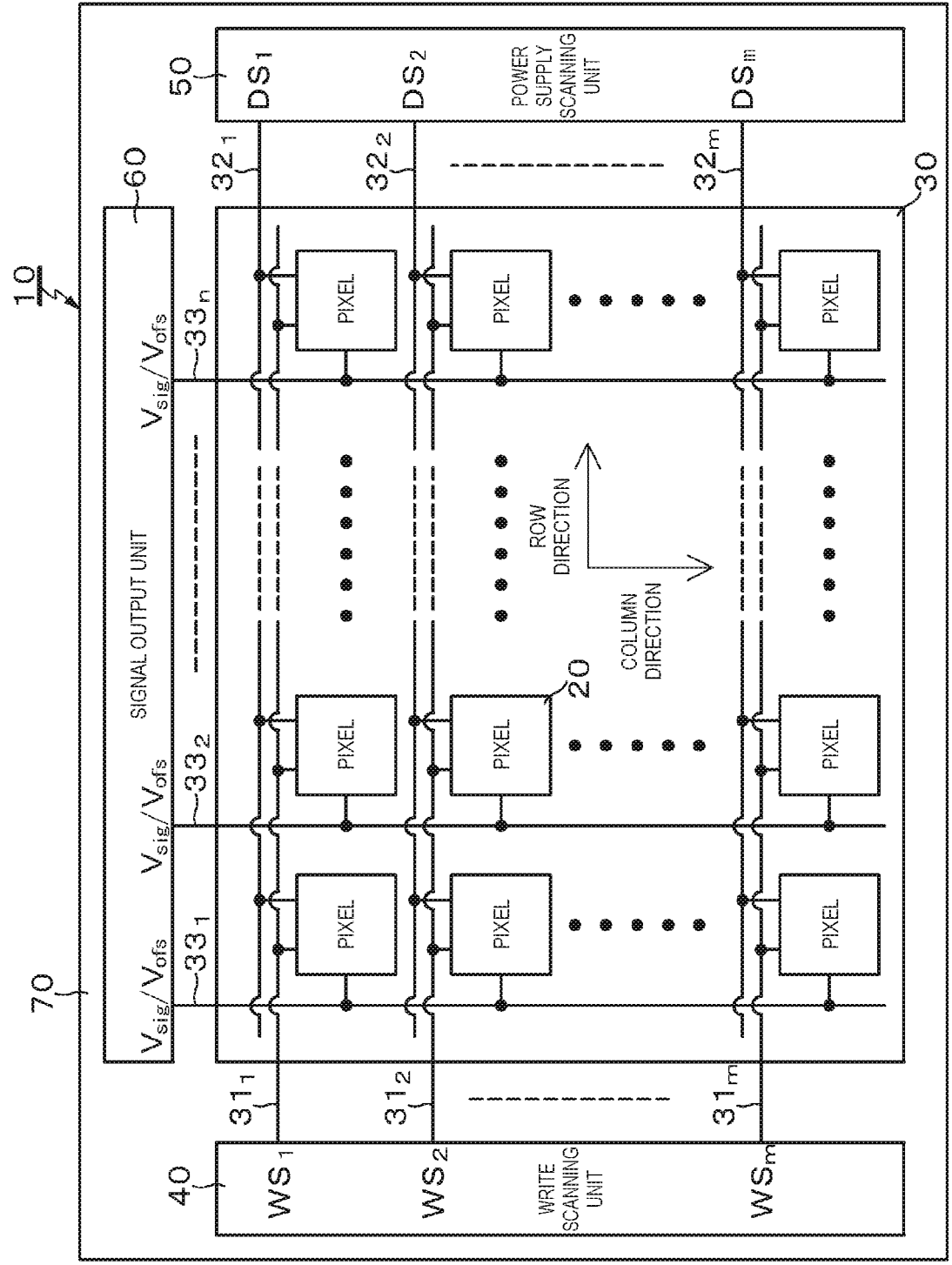
FIG. 1 is a system configuration diagram showing an overview of a basic configuration of an active-matrix organic EL display device which is a premise of the present disclosure.

Hereinafter, preferred embodiments for implementing the technology of the present disclosure (which will be described hereinafter as "embodiments") will be described in detail with reference to the appended drawings. The technology of the present disclosure is not limited to the embodiments, and the various numeric values and materials shown in the embodiments are examples. In description provided below, structural elements that have substantially the same function and structure are denoted with the same reference numerals, and repeated explanation of these structural elements is omitted. Note that description will be provided in the following order.
1. Overall description of display device, method of driving display device, and electronic device of present disclosure
2. Display device which is premise of present disclosure
2-1. System configuration
2-2. Pixel circuit
2-3. Basic circuit operation in ideal state
2-4. Shortening of mobility correction time
2-5. Pulse width adjustment circuit
3. Display device according to embodiments of present disclosure
3-1. Example 1 (example in which pixel circuit is configured by N-channel type transistor)
3-2. Example 2 (example in which pixel circuit is configured by P-channel type transistor)
4. Electronic device
4-1. Specific example 1 (example of digital camera)
4-2. Specific example 2 (example of head mounted display)

<Overall Description of Display Device, Method for Driving Display Device, and Electronic Device of Present Disclosure>

In a display device, a method for driving the display device and an electronic device of the present disclosure, a configuration in which a switch element that is provided in a peripheral circuit region of a pixel array unit and selectively applies a predetermined voltage to a common line is provided may be used.

In the display device, the method for driving the display device and the electronic device of the present disclosure having the above-described preferable configuration, a configuration in which a pixel circuit has a function of a threshold value correction process may be used. The function of the threshold value correction process is a function for changing a source voltage of a drive transistor toward a voltage obtained by subtracting a threshold value voltage of the drive transistor from an initialization voltage of a gate electrode of the drive transistor with reference to the initialization voltage of the gate electrode of the drive transistor. The predetermined voltage is a voltage to be applied to the source electrode of the drive transistor when the threshold value correction process is prepared.

Further, in the display device, the method for driving the display device and the electronic device of the present disclosure having the above-described preferable configuration, a configuration in which a switching transistor and a switch element enter a conductive state before the threshold value correction process to write a predetermined voltage into the source electrode of the drive transistor may be used. Further, a configuration in which the switch element enters a non-conductive conductive state after writing the predetermined voltage and the initialization voltage to execute the threshold value correction process may be used.

Further, in the display device, the method for driving the display device and the electronic device of the present disclosure having the above-described preferable configuration, a configuration in which the pixel circuit has a function of a mobility correction process may be used. The function of the mobility correction process is a function for correcting a mobility of the drive transistor by applying negative feedback to a potential difference between the gate electrode and the source electrode of the drive transistor by a correction amount corresponding to a current flowing in the drive transistor.

Alternatively, in the display device, the method for driving the display device and the electronic device of the present disclosure having the above-described preferable configuration, a configuration in which the common line is provided in a state in which it overlaps a wire that supplies a fixed voltage to the pixel circuit may be used. A configuration in which the wire that supplies the fixed voltage is a power supply line that supplies a drive current to the drive transistor, or is a wire that applies a back gate voltage to the drive transistor may be used.

Further, in the display device, the method for driving the display device and the electronic device of the present disclosure having the above-described preferable configuration, a configuration in which the parasitic capacitor of the common line increases a capacitance value of the entire pixel circuit, and preferably compensates for a shortage of a capacitance value of an equivalent capacitor of the light emission unit may be used. In addition, the capacitance value of the parasitic capacitor of the common line may be larger than the capacitance value of a parasitic capacitor of a retention capacitor.

Alternatively, in the display device, the method for driving the display device and the electronic device of the present disclosure having the above-described preferable configuration, a configuration in which a write scanning unit that drives a write transistor and a control scanning unit that drives the switching transistor are provided may be used. In this case, it is preferable that the write scanning unit and the control scanning unit be provided in a peripheral circuit region on the same side with respect to the pixel array unit.

<Display Device which is Premise of Present Disclosure>

[System Configuration]

FIG. 1 is a system configuration diagram showing an overview of a basic configuration of an active-matrix organic EL display device which is a premise of the present disclosure.

The active-matrix display device is a display device in which driving of a light emission unit (light emission element) is performed by an active element provided in the same pixel as the light emission unit, for example, an insulated gate field-effect transistor. Typically, a thin film transistor (TFT) can be used as the insulated gate field-effect transistor.

Here, a case in which an active-matrix organic EL display device uses an organic EL element as a light emission unit (light emission element) of a unit pixel (pixel circuit) will be described as an example. The organic El element is a current-driven electro-optical element of which light emission luminance changes in accordance with to a value of a current flowing through the device. Hereinafter, the "unit pixel/pixel circuit" is described simply as a "pixel" in some cases. The thin film transistor is used not only for control of a pixel but also for control of a peripheral circuit to be described below.

As shown in FIG. 1, an active-matrix organic EL display device 10 which is a premise of the present disclosure is configured to include a pixel array unit 30 constituted such that a plurality of unit pixels 20 are disposed 2-dimensionally in a matrix form (matrix state), and a driving unit (peripheral circuit) disposed in a peripheral region of the pixel array unit 30 and driving the pixels 20. The driving unit is constituted by, for example, a write scanning unit 40, a power supply scanning unit 50, and a signal output unit 60 and drives the pixels 20 of the pixel array unit 30.

In this example, the write scanning unit 40, the power supply scanning unit 50, and the signal output unit 60 are mounted on the same substrate as the pixel array unit 30, that is, on a display panel 70, as peripheral circuits of the pixel array unit 30. However, a configuration in which some or all of the write scanning unit 40, the power supply scanning unit 50, and the signal output unit 60 are provided outside the display panel 70 may be employed. Further, a configuration in which the write scanning unit 40 and the power supply scanning unit 50 are both disposed on one side of the pixel array unit 30 is used, or a configuration in which the write scanning unit 40 and the power supply scanning unit 50 are disposed with the pixel array unit 30 interposed therebetween may be used. As a substrate of the display panel 70, a transparent insulating substrate such as a glass substrate may be used, or a semiconductor substrate such as a silicon substrate may be used.

Here, when the organic EL display device 10 performs color display, one pixel (unit pixel) serving as a unit when forming a color image is constituted by sub pixels in a plurality of colors. In this case, each of the sub pixels corresponds to a pixel 20 of FIG. 1. To be more specific, in the display device that performs color display, one pixel is constituted by, for example, three sub pixels including a sub pixel emitting red (R) light, a sub pixel emitting green (G) light, and a sub pixel emitting blue (B) light.

One pixel, however, is not limited to a combination of sub pixels having three primary colors including RGB, and it is also possible to add sub pixels having one or more colors to the sub pixels having the three primary colors to form one pixel. To be more specific, it is possible to form one pixel by adding a sub pixel that emits white (W) light to increase luminance, or to form one pixel by adding at least one sub pixel which emits a complementary color of light to expand a color reproduction range.

In the pixel array unit 30, scanning lines 31 ($31_1$ to $31_m$) and power supply lines 32 ($32_k$ to $32_m$) are wired for each pixel row in the row direction (pixel array direction of pixel rows or horizontal direction) in the array of the pixels 20 in m rows and n columns. Furthermore, signal lines 33 ($33_1$ to $33_n$) are wired for each pixel column in the column direction (pixel array direction of pixel columns or vertical direction) in the array of the pixels 20 in m rows and n columns.

The scanning lines $31_1$ to $31_m$ are connected to respective output terminals of the corresponding rows of the write scanning unit 40. The power supply lines $32_1$ to $32_m$ are connected to respective output terminals of the corresponding rows of the power supply scanning unit 50. The signal lines $33_1$ to $33_n$ are connected to output terminals of the corresponding columns of the signal output unit 60.

The write scanning unit 40 is constituted by a shift register circuit, and the like. At the time of writing a signal voltage of a video signal onto each pixel 20 of the pixel array unit 30, the write scanning unit 40 performs so-called line sequential scanning in which each of the pixels 20 of the pixel array unit 30 is sequentially scanned in units of rows by sequentially supplying write scanning signals WS (WS$_1$ to WS$_m$) to the scanning lines 31 ($31_1$ to $31_m$).

The power supply scanning unit 50 is constituted by a shift register circuit and the like, like the write scanning unit 40. The power supply scanning unit 50 supplies power supply voltages DS (DS$_1$ to DS$_m$) that can be switched between a first power supply voltage $V_{ccp}$ and a second power supply voltage $V_{ini}$ that is lower than the first power supply voltage $V_{ccp}$ to the power supply lines 32 ($32_1$ to $32_m$) in synchronization with the line sequential scanning performed by the write scanning unit 40. As will be described later, light emission and non-light emission (light-off) of the pixels 20 are controlled by the switching of the power supply voltages DS between $V_{ccp}$ and $V_{ini}$.

The signal output unit 60 selectively outputs a signal voltage of a video signal (which may be described hereinafter simply as a "signal voltage") $V_{sig}$ that is based on luminance information supplied from a signal supply source (not shown) and a reference voltage $V_{ofs}$. Herein, the reference voltage $V_{ofs}$ is a voltage serving as a reference of the signal voltage of the video signal $V_{sig}$ (for example, a voltage equivalent to a black level of the video signal), and is used in a threshold value correction process to be described later.

The signal voltage $V_{sig}$ and the reference voltage $V_{ofs}$ output from the signal output unit 60 are written into each of the pixels 20 of the pixel array unit 30 via the signal lines 33 (33₁ to 33ₙ) in units of pixel rows selected through scanning performed by the write scanning unit 40. In other words, the signal output unit 60 employs a driving form of line sequential writing in which the signal voltage $V_{sig}$ is written in units of rows (lines).

[Pixel Circuit]

Figure 2:
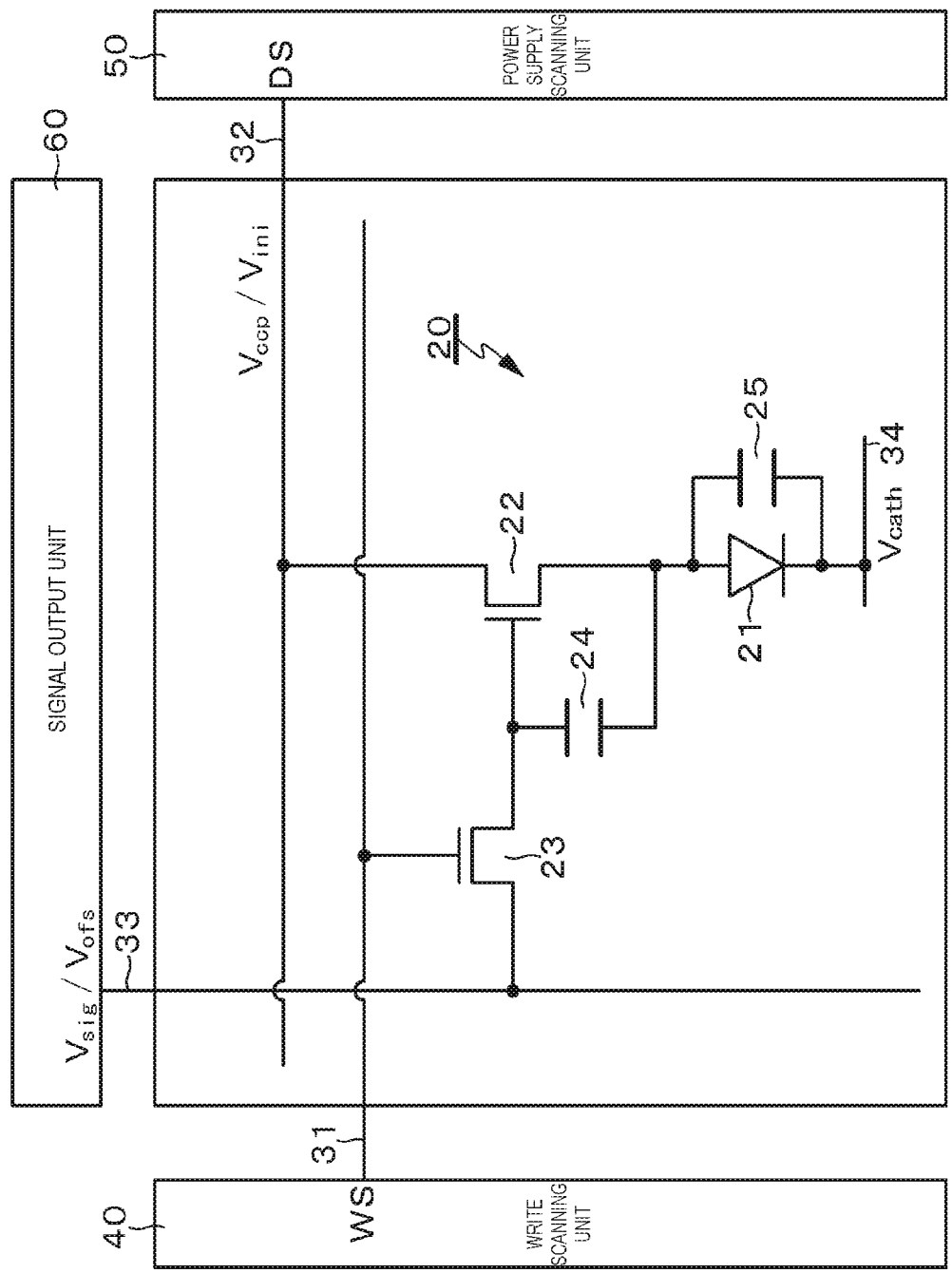
FIG. 2 is a circuit diagram showing a circuit configuration of a 2Tr2C unit pixel (pixel circuit).

FIG. 2 is a circuit diagram showing an example of a detailed circuit configuration of a unit pixel (pixel circuit) 20. The light emission unit of the pixel 20 is constituted by an organic EL element 21 that is an example of a current-driven electro-optical element of which light emission luminance changes in accordance with a value of a current flowing through the device.

As shown in FIG. 2, the pixel 20 includes the organic EL element 21 and a drive circuit that drives the organic EL element 21 by applying a current to the organic EL element 21. The cathode electrode of the organic EL element 21 is connected to a common power supply line 34 that is commonly wired for all of the pixels 20.

The drive circuit that drives the organic EL element 21 has a 2Tr2C circuit configuration including a drive transistor 22, a writing transistor 23, a retention capacitor 24, and an auxiliary capacitor 25, that is, two transistors (Tr) and two capacitative elements (C). Here, N-channel type thin film transistors (TFTs) are used as the drive transistor 22 and the writing transistor 23. Here, a conductive combination of the drive transistor 22 and the writing transistor 23 mentioned here is merely an example, but the present disclosure is not limited to this combination.

One electrode (the source or drain electrode) of the drive transistor 22 is connected to each of the power supply lines 32 (32₁ to 32ₘ) and the other electrode (the source or drain electrode) thereof is connected to the anode electrode of the organic EL element 21. One electrode (the source or drain electrode) of the writing transistor 23 is connected to each of the signal lines 33 (33₁ to 33ₙ) and the other electrode (the source or the drain electrode) thereof is connected to the gate electrode of the drive transistor 22. In addition, the gate electrode of the writing transistor 23 is connected to each of the scanning lines 31 (31₁ to 31ₘ).

With regard to the drive transistor 22 and the writing transistor 23, one electrode refers to a metal wire electrically connected to one source or drain region, and the other electrode refers to a metal wire electrically connected to the other source or drain region. In addition, one electrode may be a source electrode or a drain electrode, and the other electrode may be a drain electrode or a source electrode in accordance with the electric potential relation between the one electrode and the other electrode.

One electrode of the retention capacitor 24 is connected to the gate electrode of the drive transistor 22, and the other electrode thereof is connected to the other electrode of the drive transistor 22 and to the anode electrode of the organic EL element 21. One electrode of the auxiliary capacitor 25 is connected to the anode electrode of the organic EL element 21 and the other electrode thereof is connected to the cathode electrode of the organic EL element 21. That is, the auxiliary capacitor 25 is connected in parallel to the organic EL element 21.

In the configuration described above, the writing transistor 23 enters a conductive state in which a state of a high voltage applied to the gate electrode thereof through the scanning line 31 from the write scanning unit 40 becomes an active state in response to the write scanning signal WS. Accordingly, the writing transistor 23 performs sampling on the signal voltage of the video signal $V_{sig}$ or the reference voltage $V_{ofs}$ according to luminance information supplied from the signal output unit 60 through the signal line 33 at different time points and writes the voltages into the pixel 20. The signal voltage $V_{sig}$ or the reference voltage $V_{ofs}$ written by the writing transistor 23 are retained by the retention capacitor 24.

When the power supply voltage DS of the power supply lines 32 (32₁ to 32ₘ) becomes the first power supply voltage $V_{ccp}$, the drive transistor 22 operates in a saturation region as one electrode thereof serves as the drain electrode and the other electrode serves as the source electrode. Accordingly, the drive transistor 22 receives supply of a current from the power supply line 32 and then drives the organic EL element 21 to emit light through current driving. To be more specific, the drive transistor 22 supplies the driving current of a current value according to the voltage value of the signal voltage $V_{sig}$ retained in the retention capacitor 24 to the organic EL element 21 to drive the organic EL element 21 to emit light using the current.

Further, when the power supply voltage DS is switched from the first power supply voltage $V_{ccp}$ to the second power supply voltage $V_{ini}$, the drive transistor 22 operates as a switching transistor as one electrode thereof serves as the source electrode and the other electrode thereof serves as the drain electrode. Accordingly, the drive transistor 22 stops the supply of the driving current to the organic EL element 21 thereby setting the organic EL element 21 to be in a non-light-emission state. In other words, the drive transistor 22 also has the function as a transistor which controls light emission and non-light-emission of the organic EL element 21.

Through the switching operation of the drive transistor 22, it is possible to set a period in which the organic EL element 21 is in a non-light-emission state (non-light-emission period) and to control a ratio of a light emission period and a non-light-emission period (duty) of the organic EL element 21. With the control of the duty, it is possible to reduce after image and blur caused by light emission of the pixel over one display frame period, and particularly, to make a level of quality of a dynamic image more preferable.

Among the first and second power supply voltages $V_{ccp}$ and $V_{ini}$ which are selectively supplied from the power supply scanning unit 50 through the power supply line 32, the first power supply voltage $V_{ccp}$ is a power supply voltage for supplying a drive current that drives the organic EL element 21 to emit light to the drive transistor 22. In addition, the second power supply voltage Via is a power supply voltage for applying an inverse bias to the organic EL element 21. The second power supply voltage $V_{ini}$ is set to a voltage lower than the reference voltage $V_{ofs}$, and for example, when the threshold voltage of the drive transistor 22 is set to $V_{th}$, the second power supply voltage $V_{ini}$ is set to a voltage lower than $V_{ofs}-V_{th}$, and preferably to a voltage sufficiently lower than $V_{ofs}-V_{th}$.

Each pixel 20 of the pixel array unit 30 has the function of correcting variation of a drive current resulting from variation of characteristics of the drive transistor 22. Here, as the characteristics of the drive transistor 22, for example, the threshold voltage $V_{th}$ of the drive transistor 22, and a mobility u of a semiconductor thin film constituting a channel of the drive transistor 22 (which will be described hereinafter simply as "mobility u of the drive transistor 22") are exemplified.

Correction of a variation of a drive current caused due to the variation of the threshold voltage $V_{th}$ (which will be described hereinafter as "threshold correction") is performed by initializing a gate voltage $V_g$ of the drive transistor 22 to the reference voltage $V_{ofs}$. To be specific, an operation of setting an initialization voltage (reference voltage $V_{ofs}$) of the gate voltage $V_g$ of the drive transistor 22 as a reference and changing a source voltage $V_s$ of the drive transistor 22 toward a potential obtained by reducing the threshold voltage $V_{th}$ of the drive transistor 22 from the initialization voltage (reference voltage $V_{ofs}$) is performed. When this operation progresses, a gate-source voltage $V_{gs}$ of the drive transistor 22 soon converges on the threshold voltage $V_{th}$ of the drive transistor 22. A voltage equivalent to the threshold voltage $V_{th}$ is retained in the retention capacitor 24. By retaining the voltage equivalent to the threshold voltage $V_{th}$ in the retention capacitor 24, it is possible to suppress dependency of a drain-source current $I_{ds}$ flowing through the drive transistor 22 on the threshold voltage $V_{th}$ when the drive transistor 22 is driven at the signal voltage $V_{sig}$ of a video signal.

Correction of a variation of a drive current caused due to a variation of the mobility u (which will be described hereinafter as "mobility correction") is performed by flowing a current to the retention capacitor 24 via the drive transistor 22 in a state in which the writing transistor 23 enters a conductive state and the signal voltage $V_{sig}$ of the video signal is written. In other words, the correction is performed by applying negative feedback to the retention capacitor 24 with a feedback amount (correction amount) according to the current $I_{ds}$ flowing through the drive transistor 22. When a video signal is written through the correction of the threshold, the dependency of the drain-source current $I_{ds}$ on the threshold voltage $V_{th}$ disappears and the drain-source current $I_{ds}$ depends on the mobility u of the drive transistor 22. Accordingly, by applying negative feedback to the drain-source voltage $V_{ds}$ of the drive transistor 22 with the feedback amount according to the current $I_{ds}$ flowing through the drive transistor 22, it is possible to suppress the dependency of the drain-source current $I_{ds}$ flowing through the drive transistor 22 on the mobility u.

[Basic Circuit Configuration in Ideal State]

FIG. 3 is a timing waveform diagram for illustrating a basic circuit operation in an ideal state of the organic EL display device 10 having the above-described configuration. In the timing waveform diagram of FIG. 3, respective changes in the voltage (write scanning signals) WS of the scanning line 31, the voltage (power supply voltage) DS of the power supply line 32, the voltage ($V_{sig}/V_{ofs}$) of the signal line 33, and the gate voltage $V_g$ and the source voltage $V_s$ of the drive transistor 22 are shown.

Since the write transistor 23 is an N-channel type, the state of the high voltage of each write scanning signal WS is an active state, and the state of the low voltage thereof is a non-active state. Further, the write transistor 23 enters a conductive state in the active state of the write scanning signal WS, and enters a non-conductive state in the non-active state.

In the timing waveform diagram of FIG. 3, a period from time point $t_{11}$ to time point $t_{19}$ is a switching cycle of the voltages of the signal lines 33, that is, a switching cycle of the signal voltage $V_{sig}$ and the reference voltage $V_{ofs}$ of the video signal, and switching of the signal voltage $V_{sig}$ and the reference voltage $V_{ofs}$ is performed within 1 horizontal period (1 H).

A time prior to time point $t_{12}$ corresponds to a light emission period of the organic EL element 21 in a previous display frame. When the time reaches time point $t_{12}$, a non-light-emission period of a new display frame (current display frame) in the line sequential scanning is started. Further, a period from time point $t_{13}$ to time point $t_{15}$ during which the write scanning signal WS enters the active state is a write period in which the write transistor 23 writes the reference voltage $V_{ofs}$ into the pixels 20. In addition, a period from time point $t_{14}$ at which the voltage DS of each power supply line 32 is switched from the second power supply voltage $V_{ini}$ to the first power supply voltage $V_{ccp}$ to time point $t_{15}$ at which the write scanning signal WS transitions to the non-active state is a threshold value correction period for correcting the variation of the drive current caused by the variation of the threshold value $V_{th}$ of the drive transistor 22.

Further, during a period from time point $t_{16}$ to time point $t_{19}$, the voltage of the signal line 33 becomes the signal voltage $V_{sig}$ of the video signal. In addition, during a period from time point $t_{17}$ to time point $t_{18}$, the write scanning signal WS enters the active state again, and the write transistor 23 enters the conductive state. Thus, the signal voltage $V_{sig}$ of the video signal is written into the pixel 20 by the write transistor 23, and a mobility correction process of correcting the variation of the drive current caused by the variation of the mobility u of the drive transistor 22 is performed. That is, the period from time point $t_{17}$ to time point $t_{18}$ is a write and mobility correction period of the signal voltage $V_{sig}$. Then, when the time reaches time point $t_{18}$, the light emission period of the current frame is started.

In the timing waveform diagram of FIG. 3, $V_{cath}$ is a cathode voltage of the organic EL element 21. Further. $V_{thel}$ is a threshold value voltage of the organic EL element 21.

[Shortening of Mobility Correction Time]

In the above-described organic EL display device 10, a change in the source voltage of the drive transistor 22 which is under a mobility correction operation is determined by a relationship between a current supply capability of the drive transistor 22 and a capacitance value of the pixel capacitor connected to the source electrode of the drive transistor 22. Specifically, a source voltage V of the drive transistor 22 after the mobility correction operation is given as the following Expression (1).

$$V = V_{sig} - V_{th} - \cfrac{1}{\left(\cfrac{1}{V_{sig} - V_{th} - V_s} - \cfrac{\beta}{2C}t\right)} \quad (1)$$

Here, $V_{sig}$ represents a signal voltage of a video signal, $V_{th}$ represents a threshold value voltage of the drive transistor 22, $V_s$ represents a source voltage of the drive transistor 22 before a mobility correction operation, t represents a mobility correction time, and β represents a current supply capability of the drive transistor 22. Further, C represents a capacitance value of a pixel capacitor. In addition, when a capacitance value of the retention capacitor 24 is $C_s$, a capacitance value of an equivalent capacitor of the organic EL element 21 is $C_{oled}$, and a capacitance value of the auxiliary capacitor 25 is $C_{sub}$, $C=C_s+C_{oled}+C_{sub}$. Furthermore, the current supply capability β of the drive transistor 22 is given as the expression $\beta=u\times C_{ox}\times(W/L)$. Here, u represents a mobility of a semiconductor film that forms a channel of the drive transistor 22, $C_{ox}$ represents a gate capacitance per unit area of the drive transistor 22, W represents a channel width, and L represents a channel length.

It can be understood from Expression (1) that as the current supply capability β of the drive transistor 22 increases and the capacitance value C of the pixel capacitor decreases, an increase ($V_s \rightarrow V$) of the source voltage of the drive transistor 22 at the same mobility correction time t becomes large.

Figure 4A:
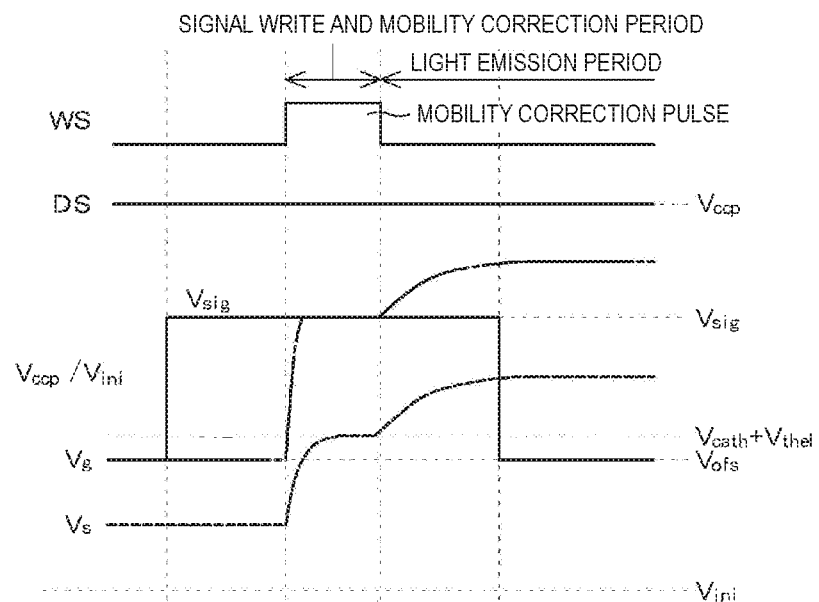
FIG. 4A shows an operation example in a case in which current supply capability of a drive transistor is large and a capacitance value of a pixel capacitor is small.

That is, in a case in which the current supply capability β of the drive transistor 22 is large and the capacitance value C of the pixel capacitor is small, as shown in FIG. 4A, an increasing speed of the source voltage $V_s$ of the drive transistor 22 which is under the mobility correction operation is fast, and thus the source voltage $V_s$ may reach a voltage value of $V_{cath}+V_{thel}$ during writing of the signal voltage $V_{sig}$. Further, since a current starts to flow in the organic EL element 21 at the moment at which the source voltage Vs of the drive transistor 22 reaches the voltage value of $V_{cath}+V_{thel}$, mobility correction is not appropriately performed, or the organic EL element 21 erroneously emits light, which becomes a factor in deterioration of uniformity.

Figure 4B:
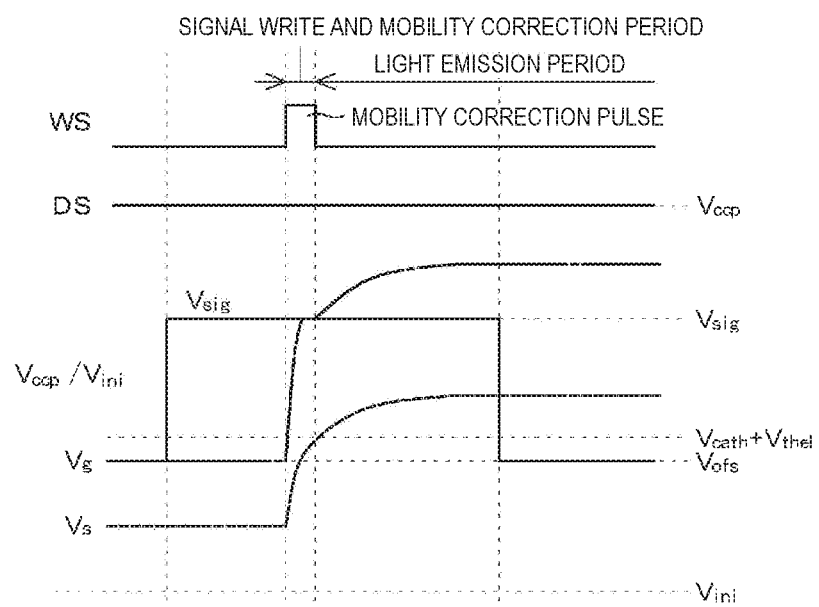
FIG. 4B shows an operation example of a case in which a mobility correction time is shortened.

Thus, as shown in FIG. 4B, a driving method for shortening the mobility correction time (signal write and mobility correction period) and terminating the mobility correction operation before a current starts to flow in the organic EL element 21, that is, before the organic EL element 21 is turned on, is considered. The mobility correction time is determined by a pulse width of a mobility correction pulse which is a second pulse of the write scanning signal WS in the timing waveform diagram of FIG. 3. Accordingly, it is possible to shorten the mobility correction time by shortening the pulse width of the mobility correction pulse. Further, in accordance with this driving method, it is possible to suppress deterioration of uniformity due to turning-on of the organic EL element 21 during the mobility correction period.

However, in order to realize the driving for terminating the mobility correction operation before the above-mentioned driving, that is, before the organic EL element 21 is turned on, it is necessary to provide a circuit for generating a mobility correction pulse of a narrow (short) pulse width. Generally, a pulse signal of a pulse width of about several 100 nsec is input to the display panel 70, and generation of the write scanning signal WS including the mobility correction pulse is performed in the display panel 70 on the basis of the pulse signal. Under such an environment, in order to shorten the pulse width of the mobility correction pulse, specifically, in order to generate a mobility correction pulse of a pulse width of about several nsec, it is necessary to form a pulse width adjustment circuit on the display panel 70.

[Pulse Width Adjustment Circuit]

Figure 5:
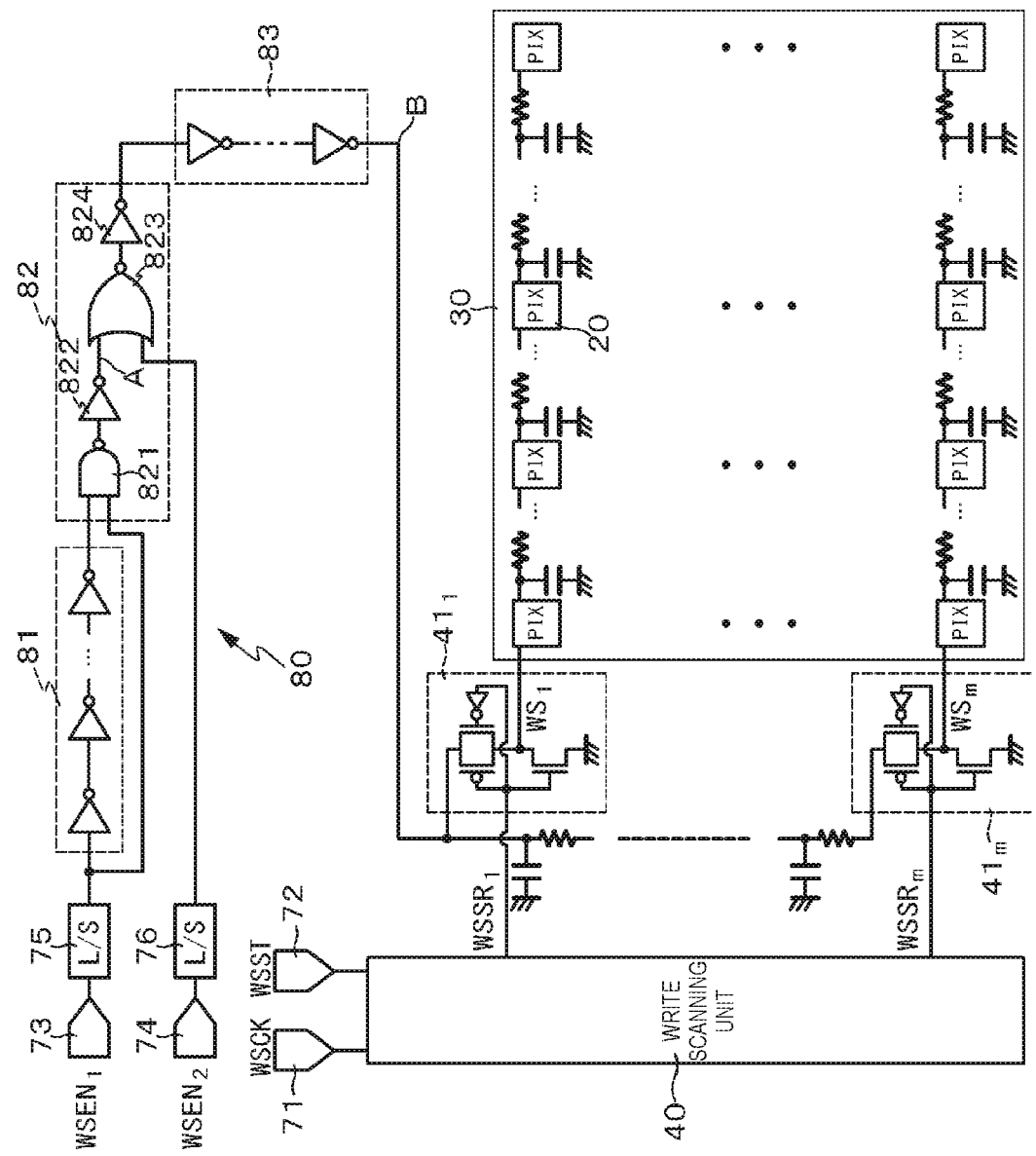
FIG. 5 is a circuit diagram illustrating a configuration example of a pulse width adjustment circuit in a peripheral circuit of a pixel array unit.

FIG. 5 shows a configuration example of a pulse width adjustment circuit in a peripheral circuit of the pixel array unit 30. FIG. 5 shows the pixel array unit 30, and the write scanning unit 40 which is one peripheral circuit thereof.

The write scanning unit 40 is configured by a shift register circuit, for example, and outputs shift signals $WSSR_1$ to $WSSR_m$ from respective shift stages on the basis of a cross pulse WSCK and a start pulse WSST input from outside the display panel 70 through input terminals 71 and 72. The shift signals $WSSR_1$ to $WSSR_m$ are supplied to respective pixel rows of the pixel array unit 30 as write scanning signals $WS_1$ to $SW_m$ including mobility correction pulses through switch circuits $41_1$ to $41_m$ provided for the each pixel row.

Further, enable signals $WSEN_1$ and $WSEN_2$ are input to a peripheral circuit on the display panel 70 through the input terminal 73 and 74. Pulse widths of the enable signals $WSEN_1$ and $WSEN_2$ are about several 100 nsec. The enable signals $WSEN_1$ and $WSEN_2$ are supplied to the pulse width adjustment circuit 80 through level shift (L/S) circuits 75 and 76. The pulse width adjustment circuit 80 is configured by a delay circuit unit 81 and a gate circuit unit 82.

The delay circuit unit 81 is a circuit part for determining a pulse width of a mobility correction pulse, and has a configuration in which a plurality of inverter circuits are connected in series. The gate circuit unit 82 is configured by a NAND circuit 821, an inverter circuit 822, a NOR circuit 823, and an inverter circuit 824. The NAND circuit 821 receives an input signal and an output signal of the delay circuit unit 81 as two inputs. An output signal of the NAND circuit 821 becomes one input signal A of the NOR circuit 823 through the inverter circuit 822. A pulse width of the input signal A is about several nsec, and becomes a pulse width of a mobility correction pulse.

The NOR circuit 823 receives the enable signal $WSEN_2$ that has passed through the level shift circuit 76 as the other input signal. An output signal of the NOR circuit 823 is supplied to a buffer circuit 83 through the inverter circuit 824. The buffer circuit 83 has a configuration in which a plurality of inverter circuits are connected in series. An output signal B of the buffer circuit 83 is supplied to the switch circuits $41_1$ to $41_m$.

Figure 6:
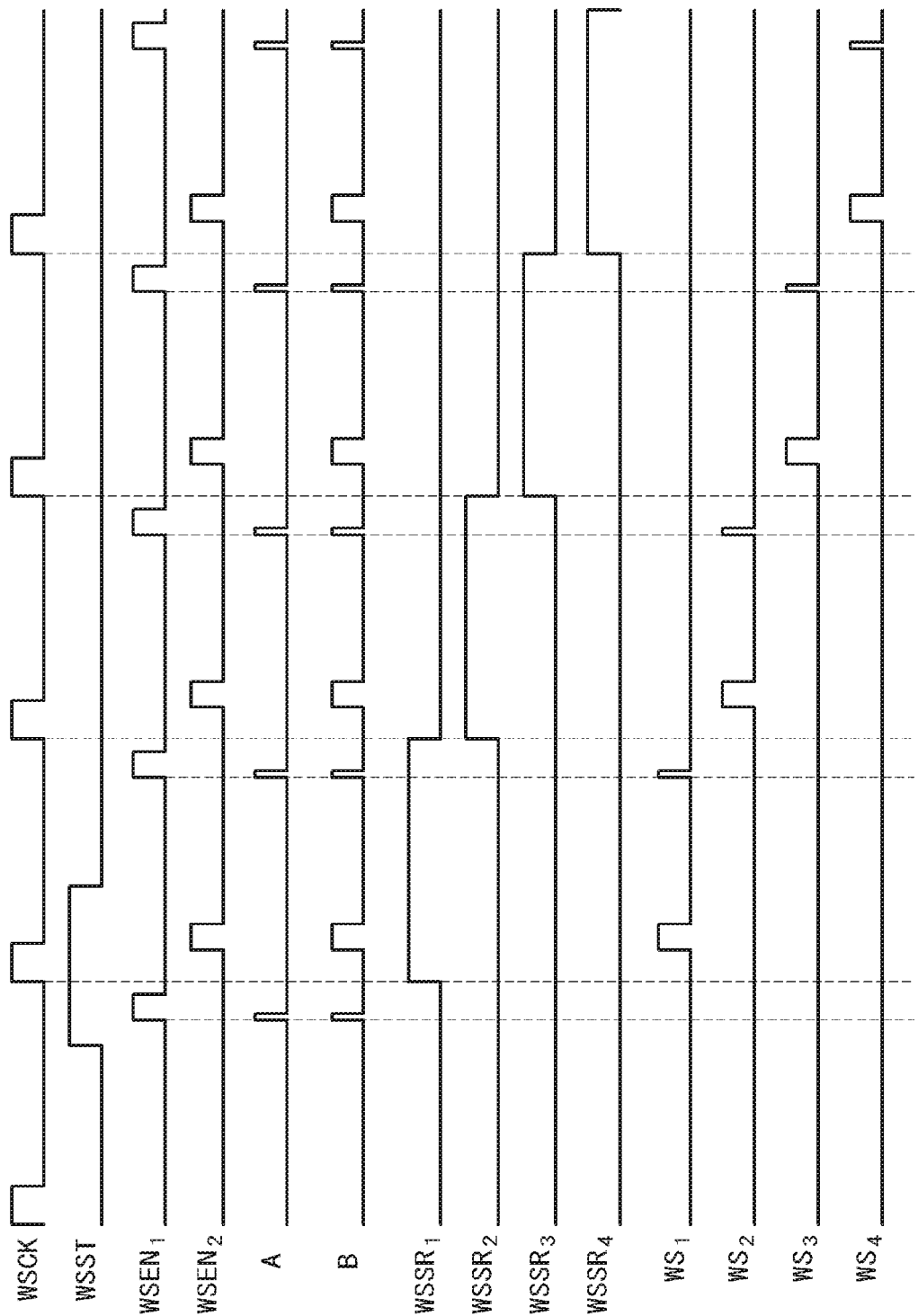
FIG. 6 is a timing waveform diagram illustrating waveforms of signals of respective units in FIG. 5.

FIG. 6 shows waveforms of signals of the respective units in FIG. 5. Specifically, FIG. 6 shows respective waveforms of the cross pulse WSCK, the start pulse WSST, the enable signals $WSEN_1$ and $WSEN_2$, the one input signal A of the NOR circuit 823, and the output signal B of the buffer circuit 83. FIG. 6 further shows respective waveforms of the shift signals $WSSR_1$, $WSSR_2$, $WSSR_3$, and $WSSR_4$ corresponding to four pixel rows of the write scanning unit 40, and the write scanning signals $WS_1$, $WS_2$, $WS_3$, and $WS_4$ corresponding to four pixel rows.

As described above, in order to shorten the pulse width of the mobility correction pulse, it is necessary to form the pulse width adjustment circuit 80 having the above-mentioned configuration on the display panel 70. Further, also when the write scanning signals WS are output to the respective pixels 20 of the pixel array unit 30, it is necessary to increase element sizes of the switch circuits $41_1$ to $41_m$ in order to prevent pulse delay. If the element sizes are increased, a parasitic capacitance attached to a wire connected to the drain electrode (the source electrode) of each of the switch circuits $41_1$ to $41_m$ is increased, and thus, it is necessary to increase the element size of the buffer circuit 83.

In this way, in order to shorten the pulse width of the mobility correction pulse, it is necessary to form the pulse width adjustment circuit 80 on the display panel 70 or to increase the element size of the buffer circuit 83, so that the circuit size of the peripheral circuits of the pixel array unit 30 increase. Thus, the area of a peripheral circuit region of the pixel array unit 30 in which the peripheral circuits are disposed on the display panel 70, that is, the area of a frame region, increases. Further, when a configuration in which a semiconductor substrate such as a silicon substrate is used as the substrate of the display panel 70 is employed, a yield (theoretical yield) is reduced, which leads to increase in the cost of the display device.

<Display Device According to Embodiment of Present Disclosure>

The active-matrix type organic EL display device according to the embodiment of the present disclosure achieves further shortening of the mobility correction period without shortening the drive pulse for mobility correction, that is, the pulse width of the mobility correction pulse. Specifically, a common line is provided (wired) along a pixel column, for each pixel column of the pixel array unit 30. In the common line wired along the pixel column, for each pixel column, there is normally a parasitic capacitor having a capacitance value larger than that of a pixel capacitor which is formed in each fine pixel circuit.

On the other hand, a switching transistor that selectively connects the common line to the source electrode of the drive transistor 22 is provided in each of the pixels (pixel circuits) 20. As the switching transistor enters a conductive state, a parasitic capacitor of the common line is added to the source electrode of the drive transistor 22, and thus, the capacitance value of the pixel capacitor C in the previous Expression (1) increases. Further, as the capacitance value of the pixel capacitor C increases, the correction period determined by the capacitance value, to be more specific, the mobility correction period, can be shortened.

That is, since it is possible to increase the capacitance value of the pixel capacitor C by using the parasitic capacitor of the common line as the pixel capacitor C, even though the pulse width of the mobility correction pulse is not narrowed, it is possible to shorten the mobility correction period. The fact that the pulse width of the mobility correction pulse does not need to be narrowed means that the pulse width adjustment circuit 80 (see FIG. 5) for shortening the pulse width of the mobility correction pulse does not need to be formed on the display panel 70. Accordingly, it is possible to shorten the mobility correction period without increasing the circuit size of the peripheral circuits of the pixel array unit 30. Further, due to the shortening of the mobility correction period, it is possible to suppress deterioration of uniformity due to turning-on of the organic EL element 21 during the mobility correction period.

In addition, since it is possible to reduce the circuit size of the peripheral circuits of the pixel array unit 30, it is possible to narrow a frame of the display panel 70 compared with a case in which the pulse width of the mobility correction pulse is shortened, and thus it is possible to reduce the size of the display panel 70. Further, when a configuration in which a semiconductor substrate such as a silicon substrate is used as the substrate of the display panel 70 is employed, improvement in a yield is expected, and thus it is possible to contribute to cost reduction of the display device.

The above-described technology of the present disclosure may not only be applied to a case in which a transistor that forms the pixels (pixel circuit) 20 is formed by an N-channel type transistor, but may also be applied to a case in which the transistor is formed by a P-channel type transistor. Hereinafter, a pixel circuit formed by an N-channel type transistor will be described as a pixel circuit according to Example 1, and a pixel circuit formed by a P-channel type transistor will be described as a pixel circuit according to Example 2. As will be obvious from the following description, the pixel circuit according to Example 1 has an advantage in that the number of components of the pixel circuit is less than that of the pixel circuit according to Example 2.

In the respective examples to be described hereinafter, a case in which a semiconductor substrate such as a silicon substrate is used as the substrate of the display panel 70 will be described as an example, but the invention is not limited thereto. That is, a semiconductor substrate such as a silicon substrate may be used as the substrate of the display panel 70, and a transparent insulated substrate such as a glass substrate may also be used.

Example 1

Figure 7:
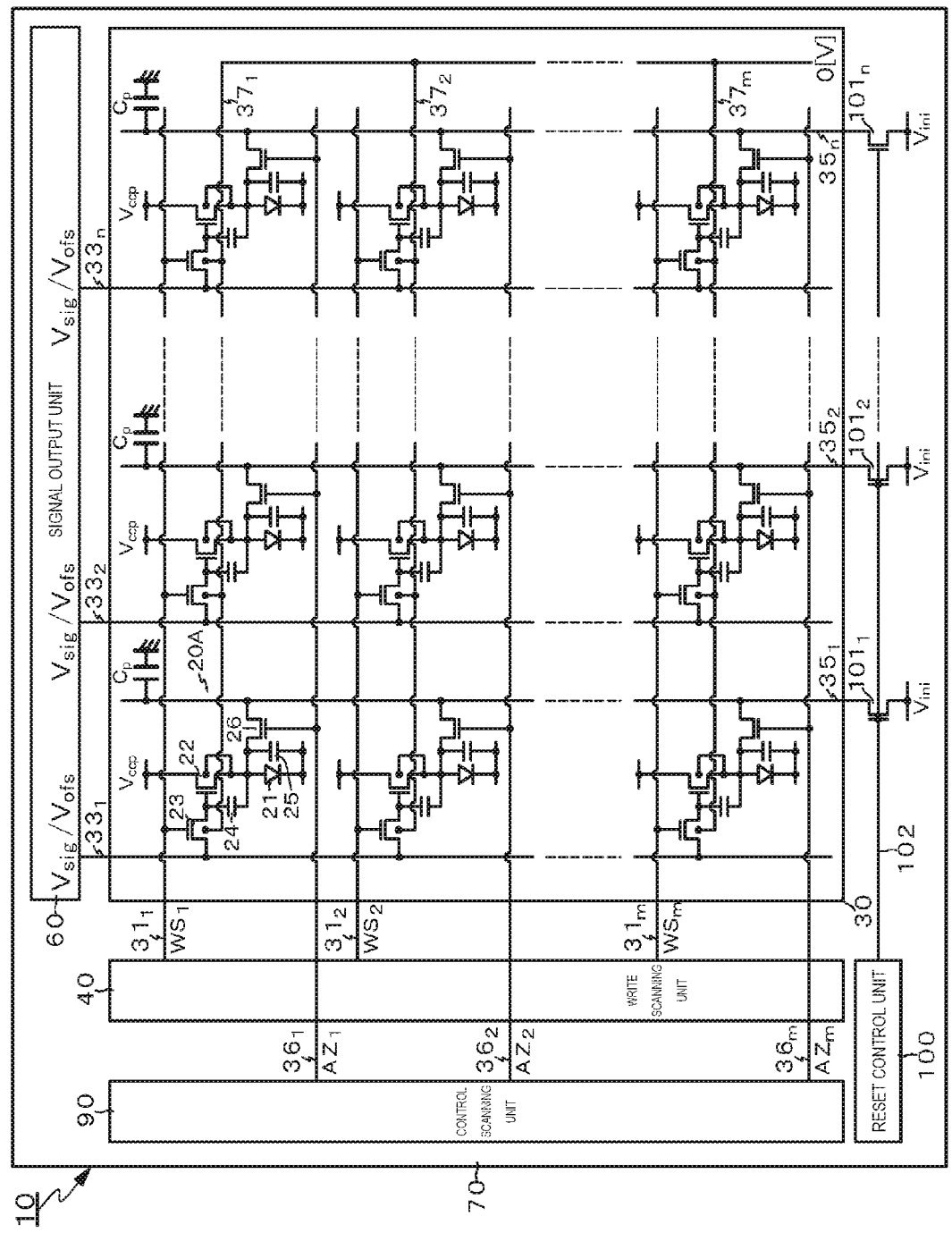
FIG. 7 is a system configuration diagram illustrating an overview of a configuration of an organic EL display device including pixel circuits according to Example 1.

FIG. 7 is a system configuration diagram illustrating an overview of a configuration of the organic EL display device including the pixel circuit according to Example 1.

As shown in FIG. 7, a pixel circuit 20A according to Example 1 is configured to include a switching transistor 26, in addition to the organic EL element 21, the drive transistor 22, the write transistor 23, the retention capacitor 24, and the auxiliary capacitor 25. The drive transistor 22, the write transistor 23, and the switching transistor 26 are formed by an N-channel type MOS transistor.

The auxiliary capacitor 25 is a component for supporting the equivalent capacitor of the organic EL element 21, and is not an essential component. Accordingly, when the equivalent capacitor of the organic EL element 21 can be sufficiently secured, a circuit configuration in which the auxiliary capacitor 25 is removed may also be used.

The pixel circuits 20A having such a configuration are 2-dimensionally disposed in a matrix form to form a pixel array unit 30. Each of common wires $35_1$ to $35_n$ (these may be generally referred to hereinafter as "common wires 35") is wired along the pixel column, for each pixel column, with respect to the matrix arrangement of the pixel circuits 20A.

In the pixel circuit 20A, the switching transistor 26 is connected between the source electrode of the drive transistor 22 and the common line 35. Further, the gate electrode of the switching transistor 26 is connected to each of control lines $36_1$ to $36_m$ (these may be generally referred hereinafter to as "control lines 36") wired along the pixel row, for each pixel row.

An organic EL display device 10 including the pixel circuits 20A according to Example 1 includes a control scanning unit 90, in addition to the write scanning unit 40 and the signal output unit 60, as peripheral circuits of the pixel array unit 30. The control scanning unit 90 is provided in a peripheral circuit region (frame region) on the same side as the write scanning unit 40 with respect to the pixel array unit 30, for example. To be more specific, the control scanning unit 90 is provided in peripheral circuit region on one side in the lateral direction (row direction) of the pixel array 30. A configuration in which the write scanning unit 40 and the control scanning unit 90 are disposed in both peripheral circuit regions in the lateral direction of the pixel array unit 30 with the pixel array unit 30 interposed therebetween may be employed.

One terminal of each of the control lines $36_1$ to $36_m$ is connected to an output terminal of a corresponding row of the control scanning unit 90). The control scanning unit 90 is configured by a shift register circuit or the like, similar to the write scanning unit 40. The control scanning unit 90 outputs control signals $AZ_1$ to $AZ_m$ (these may be generally referred to hereinafter as "control signals AZ") which are in an active state over a period from the time before the threshold value correction process is started to the time after the mobility correction process is terminated, in synchronization with the line sequential scanning performed by the write scanning unit 40.

The control signal AZ is applied to the gate electrode of the switch transistor 26 through each of the control lines $36_1$ to $36_m$ (these may be referred to hereinafter as "control lines 36") wired along the pixel row, for each pixel row. In the pixel circuit 20A, the switching transistor 26 enters a conductive state in response to the control signal AZ applied to the gate electrode through the control line 36, to thereby selectively connect the source electrode of the drive transistor 22 and the common line 35.

The organic EL display device 10 including the pixel circuits 20A according to Example 1 includes a reset control unit 100, in addition to the write scanning unit 40, the signal output unit 60, and the control scanning unit 90, as peripheral circuits of the pixel array unit 30. On the other hand, in the peripheral circuit region (frame region) of the pixel array unit 30, each of switch elements 101$_1$ to 101$_n$ (these may be referred to hereinafter as "switch elements 101") is connected to one terminal of each of the common lines 35$_1$ to 35$_n$.

The switch elements 101$_1$ to 101$_n$ are configured by N-channel type MOS transistors, for example, and the respective gate electrodes thereof are commonly connected to a reset line 102. One terminal of the reset line 102 is connected to an output terminal of the reset control unit 100. The reset control unit 100 outputs a reset signal RS which is in an active state at a cycle of 1 H (1 horizontal period) to the reset line 102. The switch elements 101$_1$ to 101$_n$ enter a conductive state in response to the reset signal RS applied to the gate electrodes thereof through the reset line 102, to thereby selectively apply a predetermined voltage to the common lines 35$_1$ to 35$_n$. The predetermined voltage is a voltage applied to the source electrode of the drive transistor 22 when the threshold value correction process is prepared, that is, the second power supply voltage $V_{ini}$.

In the pixel circuit 20A according to Example 1 having such a configuration, the drain electrode of the drive transistor 22 is connected to a fixed power supply of the first power supply voltage $V_{ccp}$. That is, in the pixel circuit 20A according to Example 1, the pixel power supply may be the fixed power supply (direct current power supply) differently from the power supply voltage DS of the pixel circuit 20 shown in FIG. 20.

Further, as the substrate of the display panel 70 is formed of a semiconductor substrate such as a silicon substrate, the drive transistor 22, the write transistor 23, and the switching transistor 26 are configured to have four terminals of a source, a gate, a drain, and a back gate. Further, as the drive transistor 22, the write transistor 23, and the switching transistor 26 are configured by N-channel type MOS transistors, the back gate is fixed at a predetermined potential, specifically, at 0 [V]. Specifically, 0 [V] is applied to the back gate of the write transistor 23 through each of back gate lines 37$_1$ to 37$_m$ (these may be referred to hereinafter as "back gate lines 37"). Further, the back gate of the drive transistor 22 is connected to the source electrode of the drive transistor 22.

As described above, the organic EL display device 10 including the pixel circuits 20A according to Example 1 is configured with each of the common lines 35 wired along the pixel column for each pixel column and selectively connected to the source electrode of the drive transistor 22 through the switching transistor 26 for each pixel. Further, the common lines 35 are selectively connected to the power supply line of a predetermined voltage, specifically, the second power supply voltage $V_{ini}$ through the switch element 100, outside the region (that is, the peripheral circuit region) of the pixel array unit 30.

Here, each of the common lines 35 has a parasitic capacitor $C_p$ formed between the common line 35 and a peripheral layout of the common line 35. Specifically, the common line 35 is provided in a state in which it overlaps (crosses) the wire that supplies a fixed voltage to the pixel circuits 20A, and thus the parasitic capacitor $C_p$ is formed between the common line 35 and a layout of the wire or the like. As example of the wire that supplies the fixed voltage, a power supply line (a wire between the fixed power supply of the power supply voltage $V_{ccp}$ and the drain electrode of the drive transistor 22) that supplies a drive current to the drive transistor 22, the back gate line 37 that applies a back gate voltage to the write transistor 23, or the like may be used.

It is obvious that a capacitance value of the parasitic capacitor $C_p$ of the common line 35 is extremely larger than the capacitance value C ($=C_s+C_{oled}+C_{sub}$) of the pixel capacitor which is individually formed by each fine pixel circuit 20A. Further, as the switching transistor 26 enters a conductive state and the common line 35 is connected to the source electrode of the drive transistor 22, the capacitance value of the parasitic capacitor $C_p$ is combined with the capacitance value C of the pixel capacitor. Thus, the parasitic capacitor $C_p$ of the common line 35 increases the entire capacitance value (that is, the capacitance value C of the pixel capacitor) of the pixel circuit 20A, and compensates for a shortage of the capacitance value $C_{oled}$ of the equivalent capacitor of the organic EL element 21.

In this way, by using the capacitance value of the parasitic capacitor $C_p$ in each pixel circuit 20A in the mobility correction operation, it is possible to increase the percentage of the capacitance value C ($=C_s+C_{oled}+C_{sub}+C_p$) to the current supply capability β of the drive transistor 22. Thus, it is possible to delay a rising speed of the source voltage $V_s$ of the drive transistor 22 in the mobility correction operation, and thus, it is possible to further shorten the mobility correction period even without preparing a mobility correction pulse of a narrow pulse width.

(Circuit Operation)

Figure 8:
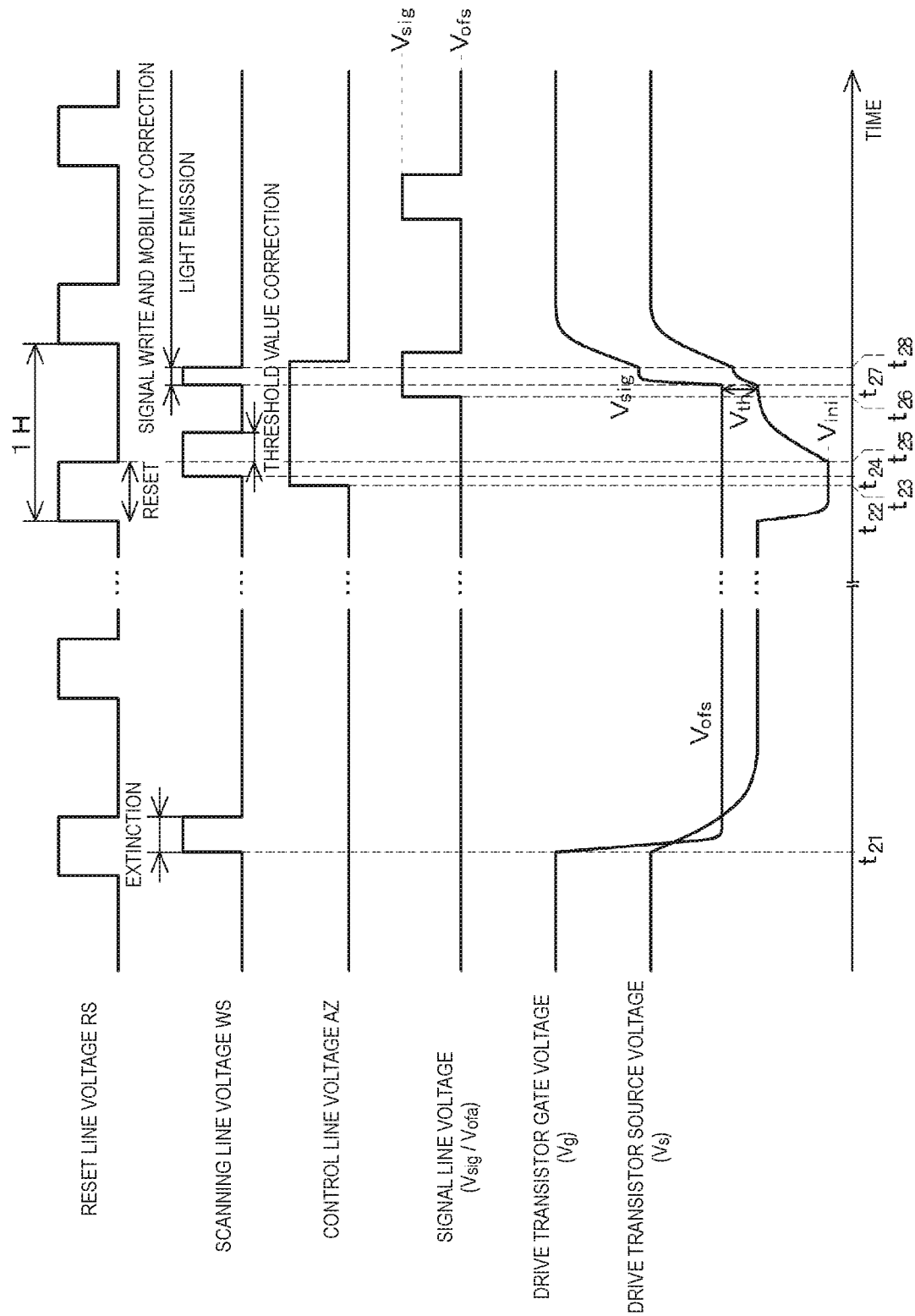
FIG. 8 is a timing waveform diagram for describing a circuit operation of the organic EL display device including the pixel circuits according to Example 1.

Next, a circuit operation of the organic EL display device 10 including the pixel circuits 20A according to Example 1 will be described with reference to a timing waveform diagram of FIG. 8. The timing waveform diagram of FIG. 8 shows changes in waveforms of the voltage (reset signal) RS of the reset line 102, the voltage (write scanning signal) WS of the scanning line 31, the voltage (control signal) AZ of the control line 36, the voltage ($V_{sig}/V_{ofs}$) of the signal line 33, and the gate voltage $V_g$ and the source voltage $V_s$ of the drive transistor 22.

Since the write transistor 23, the switching transistor 26, and the switch element 11 are configured by N-channel type transistors, high voltage states of the write scanning signal WS, the control signal AZ, and the reset signal RS are active states, and low voltage states thereof are non-active states. Further, the write transistor 23 enters a conductive state in the active state of the write scanning signal WS, and enters a non-conductive state in the non-active state thereof. The switching transistor 26 enters a conductive state in the active state of the control signal AZ, and enters a non-conductive state in the non-active state thereof. In addition, the switch element 101 enters a conductive state in the active state of the reset signal RS, and enters a non-conductive state in the non-active state thereof.

As the write signal WS enters the active state at time point $t_{21}$ in a state in which the voltage of the signal line 33 becomes the reference voltage $V_{ofs}$ from the light emission state of the organic EL element 21, the write transistor 23 enters the conductive state. Thus, since the reference voltage $V_{ofs}$ is written into the gate electrode of the drive transistor 22, supply of a drive current to the organic EL element 21 from the drive transistor 22 is stopped. As a result, the organic EL element 21 enters an extinction state.

Then, as the reset signal RS enters the active state at time point $t_{22}$, the switch element 10 enters the conductive state, and the second power supply voltage $V_{ini}$ is written into the common line 35, to thereby reset the potential of the common line 35. Subsequently, as the control signal AZ enters the active state at time point $t_{23}$, the switching transistor 26 enters the conductive state. Thus, the second power supply voltage $V_{ini}$ is written into the source electrode of the drive transistor 22 from the common line 35 through the switching transistor 26, and thus preparation of the threshold correction operation is started.

Then, after the write scanning signal WS enters the active state at time point $t_{24}$, as the reset signal RS enters the non-active state at time point $t_{25}$, while the control signal AZ is in the active state, that is, while the switching transistor 26 is in the conductive state, the threshold value correction process is started. Further, the voltage of the signal line 33 is switched from the reference voltage $V_{ofs}$ to the signal voltage $V_{sig}$ of the video signal at time point $t_{25}$ during the active period of the control signal AZ.

Thereafter, as the write scanning signal WS enters the active state again at time point $t_{27}$ while the control signal AZ is in the active state, the write transistor 23 enters the conductive state. Thus, the signal voltage $V_{sig}$ of the video signal is written into the pixel circuit 20A by the write transistor 23, and a mobility correction process of correcting a variation of a drive current caused by the variation of the mobility u of the drive transistor 22 is performed. Further, the mobility correction process is terminated at time point $t_{28}$ at which the write scanning signal WS enters the non-active state.

That is, a period from time point $t_{27}$ to time point $t_{28}$ becomes a write and mobility correction period of the signal voltage $V_{sig}$. Further, at time point $t_{28}$, in a state in which a retention voltage of the retention capacitor 24 is maintained at a constant level, a so-called bootstrap operation for raising the gate voltage Vg and the source voltage Vs of the drive transistor 22 is performed, to thereby transition to a light emission operation.

As is obvious from the above-described circuit operation, the threshold value correction process and the mobility correction process are executed during the 1 H period. This circuit operation is characterized in that the mobility correction process is performed while the switching transistor 26 is in the conductive state, that is, while using the parasitic capacitor Cp of the common line 35. By using this circuit operation, since a current flows in a large capacitance ($=C_s+C_{oled}+C_{sub}+C_p$) with respect to the current supply capability β of the drive transistor 22, in view of the above-described Expression (1), it is possible to delay a processing speed of mobility correction (that is, to prolong the mobility correction time).

Thus, the following effects can be obtained. That is, since it is not necessary to prepare a mobility correction pulse of a narrow pulse width for mobility correction and it is not necessary to form the pulse width adjustment circuit 80 (see FIG. 5) that generates the mobility correction pulse on the display panel 70, it is possible to appropriately perform a mobility correction operation without increasing the circuit size of the peripheral circuits of the pixel array unit 30.

In other words, compared with a case in which the pulse width adjustment circuit 80 is formed on the display panel 70, it is possible to shorten a mobility correction period while decreasing the circuit size of the peripheral circuits of the pixel array 30. Further, by reducing the circuit size of the peripheral circuits, it is possible to narrow a frame of the display panel 70. As a result, it is possible to reduce the size of the display panel 70. In addition, by shortening the mobility correction period, it is possible to suppress deterioration of uniformity due to turning-on of the organic EL element 21 during the mobility correction period.

Further, in the pixel circuit 20A according to Example 1, an operation of setting the source voltage $V_s$ of the drive transistor 22 to the second power supply voltage $V_{ini}$ before the threshold value correction operation is performed through the common line 35 and the switching transistor 26.

Thus, it is possible to set a power supply that supplies a drive current to the drive transistor 22 as a fixed power supply of the first power supply voltage $V_{ccp}$ to simplify the power supply unit, and thus it is possible to reduce the circuit size of the peripheral circuits of the pixel array unit 30.

In the case of the pixel circuit 20 shown in FIG. 2, by setting the power supply that supplies the drive current to the drive transistor 22 as a variable power supply of the power supply voltage DS ($V_{ccp}/V_{ini}$), the source voltage $V_s$ is set to the second power supply voltage $V_{ini}$ through the drive transistor 22. In this way, if the power supply is set as a variable power supply capable of being switched between the first power supply voltage $V_{ccp}$ and the second power supply voltage $V_{ini}$, it is necessary to provide a buffer circuit of a large circuit size in an output stage of the power supply scanning unit 50 (see FIG. 1) for each row, and thus, the circuit size of the peripheral circuits of the pixel array unit 30 becomes large.

On the other hand, in the pixel circuit 20A according to Example 1, since it is not necessary to provide the power supply scanning unit 50 in which the buffer circuit of the large circuit size is necessary for each row, it is possible to reduce the circuit size of the peripheral circuits of the pixel array unit 30. Here, when a configuration in which a semiconductor substrate such as a silicon substrate is used as the substrate of the display panel 70 is employed, improvement in a yield is expected, and thus it is possible to contribute to cost reduction of the display device.

Further, since an optimal correction margin increases as the processing speed of the mobility correction slows down, it is possible to contribute to improvement of uniformity. In addition, in a signal write period, since the large parasitic capacitor $C_p$ of the common line 35 is added to the source electrode of the drive transistor 22, it is possible to suppress increase in the source voltage $V_s$ at the time of writing the signal voltage $V_{sig}$ of the video signal. Thus, a write gain G of the signal voltage $V_{sig}$ increases, and thus, it is possible to realize lowering amplitude of the signal voltage $V_{sig}$ of the video signal and to contribute to low power consumption.

Here, the write gain G is a ratio of the retention voltage $V_{gs}$ of the retention capacitor 24 with respect to the signal voltage $V_{sig}$ of the video signal, and is given as the following Expression (2).

$$V = V_{gs}/V_{sig} \quad (2)$$
$$= 1 - \left(\frac{C_{cs}+C_{gs}}{C_{cs}+C_{gs}+C_{oled}+C_{sub}+C_p}\right)$$

Here, $C_{gs}$ represents a capacitance value of a capacitor between the gate electrode and the source electrode of the drive transistor 22.

Further, in the pixel circuit 20A according to Example 1, the control scanning unit 90 is provided in the peripheral circuit region on the same side as the write scanning unit 40 with respect to the pixel array unit 30. Thus, it is possible to set distances from the write scanning unit 40 and the control scanning unit 90 to the pixel circuit 20A which is a drive target to be approximately equal to each other, and thus it is possible to minimize a timing deviation caused by a difference between the distances between the write scanning signal WS and the control signal AZ. As a result, it is possible to more reliably perform driving with respect to the pixel circuit 20A which is the drive target.

Example 2

Figure 9:
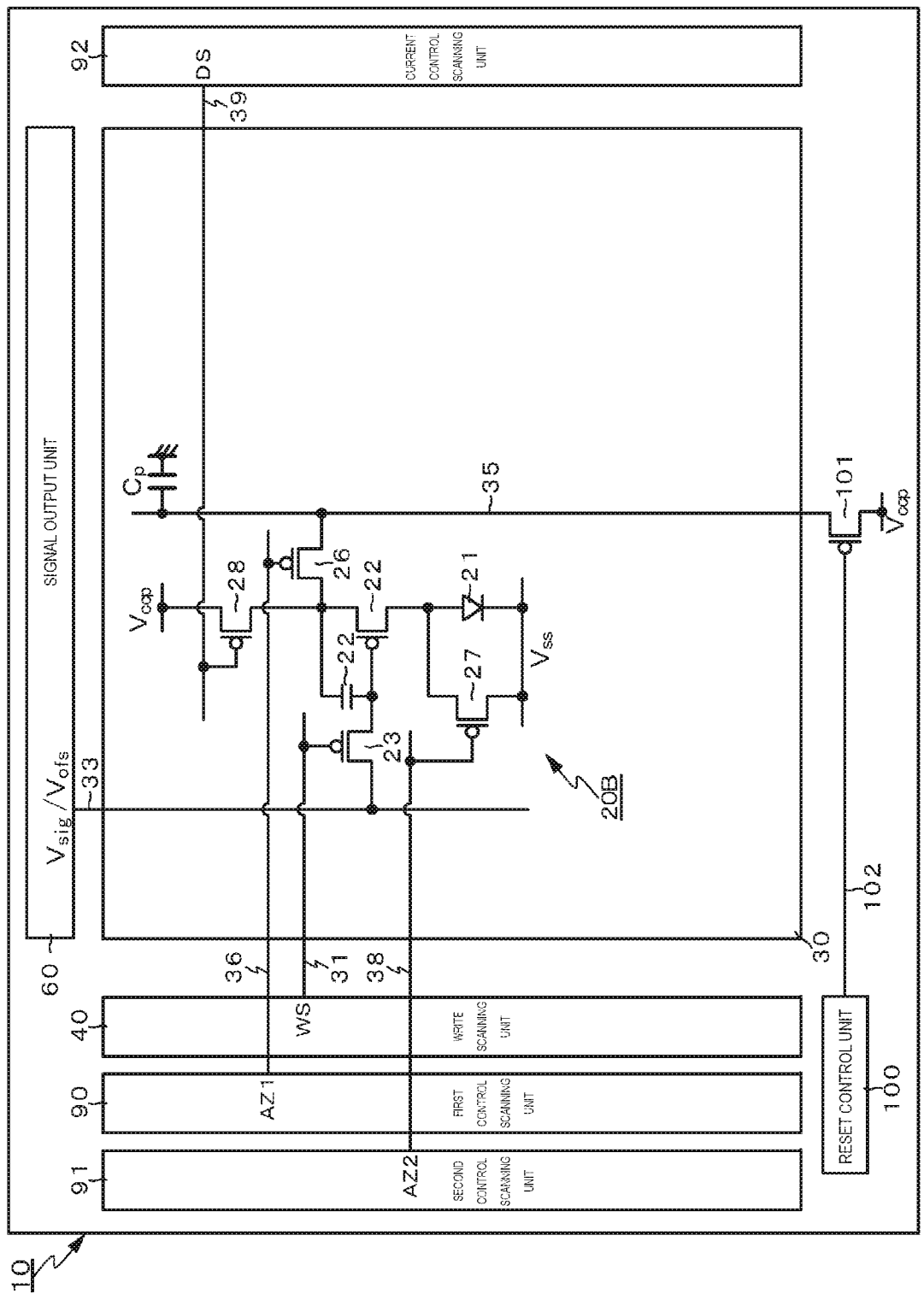
FIG. 9 is a system configuration diagram illustrating an overview of a configuration of an organic EL display device including pixel circuits according to Example 2.

FIG. 9 is a system configuration diagram illustrating an overview of a configuration of an organic EL display device including a pixel circuit according to Example 2.

As shown in FIG. 9, a pixel circuit 20B according to Example 2 is configured to include first and second switching transistors 26 and 27 and a current control transistor 28, in addition to the organic EL element 21, the drive transistor 22, the write transistor 23, and the retention capacitor 24. The drive transistor 22, the write transistor 23, the first and second switching transistors 26 and 27, and the current control transistor 28 are formed by P-channel type MOS transistors.

The pixel circuits 20B having such a configuration are 2-dimensionally disposed in a matrix form to form a pixel array unit 30. Here, for simplification of illustration, only one pixel circuit 20B is shown. The common wire 35 is wired along the pixel column for each pixel column, with respect to the matrix arrangement of the pixel circuits 20B.

An organic EL display device 10 including the pixel circuits 20B according to Example 2 includes a first control scanning unit 90, a second control scanning unit 91, and a current control scanning unit 92, in addition to the write scanning unit 40 and the signal output unit 60, as peripheral circuits of the pixel array unit 30. The first control scanning unit 90 and the second control scanning unit 91 are provided in a peripheral circuit region on the same side as the write scanning unit 40 with respect to the pixel array unit 30, to be more specific, in a peripheral circuit region on one side 30 in the lateral direction (row direction) of the pixel array, for example.

In the pixel circuit 20B, the first switching transistor 26 is connected between the source electrode of the drive transistor 22 and the common line 35. Further, the gate electrode of the first switching transistor 26 is connected to a first control line 36 wired along the pixel row, for each pixel row. One terminal of the first control line 36 is connected to an output terminal of a corresponding row of the first control scanning unit 90. The first control scanning unit 90 is configured by a shift register circuit or the like, similar to the write scanning unit 40. The first control scanning unit 90 outputs a first control signal AZ1 which is in an active state (in this example, a low voltage state) over a period from the time before the threshold value correction process is started to the time after the mobility correction process is terminated, in synchronization with the line sequential scanning performed by the write scanning unit 40.

The second switching transistor 27 is connected between a connect node between the drain electrode of the drive transistor 22 and the anode electrode of the organic EL element 21, and the power supply line of a power supply voltage $V_{cc}$ on a low potential side. Further, the gate electrode of the second switching transistor 27 is connected to a second control line 38 wired along the pixel row, for each pixel row. One terminal of the second control line 38 is connected to an output terminal of a corresponding row of the second control scanning unit 91. The second control scanning unit 91 is configured by a shift register circuit or the like, similar to the write scanning unit 40. The second control scanning unit 91 outputs a second control signal AZ2 which is in an active state over a period from the time before the threshold value correction process is started to the time when light emission is started, in synchronization with the line sequential scanning performed by the write scanning unit 40.

The current control transistor 28 is connected between a power supply line of a power supply voltage $V_{dd}$ on a high potential side and the source electrode of the drive transistor 22. Further, the gate electrode of the current control transistor 28 is connected to a third control line 39 wired along the pixel row, for each pixel row. One terminal of the third control line 39 is connected to an output terminal of a corresponding row of the current control scanning unit 92. The second control scanning unit 92 is configured by a shift register circuit or the like, similar to the write scanning unit 40. The current control scanning unit 92 outputs a current control signal DS which is in a non-active state (in this example, a high voltage state) over a period from the time when the threshold value correction process is started to the time before the light emission is started and is in an active state in a period of time other than the above-mentioned period of time, in synchronization with the line sequential scanning performed by the write scanning unit 40.

The organic EL display device 10 including the pixel circuits 20B according to Example 2 includes a reset control unit 100, in addition to the write scanning unit 40, the signal output unit 60, the first control scanning unit 90, the second control scanning unit 91, and the current control scanning unit 92, as peripheral circuits of the pixel array unit 30. On the other hand, in a peripheral circuit region (frame region) of the pixel array unit 30, a switch element 101 is connected to one terminal of the common line 35.

The switch element 101 is configured by a P-channel type MOS transistor, for example, and the gate electrode thereof is connected to the reset line 102. One terminal of the reset line 102 is connected to an output terminal of the reset control unit 100. The reset control unit 100 outputs a reset signal RS which is in an active state at a cycle of 1 H to the reset line 102. The switch element 101 enters a conductive state in response to the reset signal RS applied to the gate electrode thereof through the reset line 102, to thereby selectively apply a predetermined voltage to the common line 35. The predetermined voltage is a voltage applied to the source electrode of the drive transistor 22 when the threshold value correction process is prepared, that is, the power supply voltage $V_{ccp}$ on a high voltage side.

Here, a case in which the substrate of the display panel 70 is configured by a semiconductor substrate such as a silicon substrate is described as an example. Accordingly, the drive transistor 22, the write transistor 23, the first and second switching transistors 26 and 27, and the current control transistor 28 are configured to have four terminals including back gates. Further, the transistors 22, 23, and 26 to 28 are configured by P-channel type MOS transistors, and thus the back gates thereof are fixed at a predetermined potential, specifically, to the power supply voltage $V_{ccp}$ on the high potential side.

In FIG. 9, for simplification of illustration, the power supply voltage $V_{ccp}$ on the high potential side is not shown for each back gate line applied to each of the transistors 22, 23, 26 to 28, but similar to the case of Example 1, the common line 35 is provided in a state in which it overlaps (crosses) the back gate line.

[Circuit Operation]

Next, a circuit operation of the organic EL element 10 including the pixel circuits 20B according to Example 2 will be described with reference to a timing waveform diagram of FIG. 10. The timing waveform diagram of FIG. 10 shows respective changes in the voltage ($V_{sig}/V_{ofs}$) of the signal line 33, the current control signal DS, the first and second control signals AZ1 and AZ2, the write scanning signal WS, the reset signal RS, and the source voltage $V_s$, the gate voltage $V_g$, and the drain voltage $V_d$ of the drive transistor 22.

Since each transistor of the pixel circuit 20B is configured by a P-channel type transistor, a low voltage state of each of the current control signal DS, the first and second control signals AZ and AZ2, the write scanning signal WS, and the reset signal RS becomes an active state, and a high voltage state thereof becomes a non-active state. Further, the write transistor 23 enters a conductive state in the active state of the high voltage state, and enters a non-conductive state in the non-active state. The first and second switching transistors 26 and 27 enter a conductive state in the active state of the first and second control signals AZ1 and AZ2, and enter a non-conductive state in the non-active state. The current control transistor 28 enters the conductive state in the active state of the current control signal DS, and enters the non-conductive state in the non-active state thereof. Further, the switch element 101 enters a conductive state in the active state of the reset signal RS, and enters a non-conductive state in the non-active state.

In the timing waveform of FIG. 10, a period from time point $t_{31}$ to time point $t_{42}$ is 1 horizontal period (1 H). In a state in which the voltage of the signal line 33 becomes the reference voltage $V_{ofs}$ from a light emission state of the organic EL element 21, the write scanning signal WS and the first and second control signals AZ1 and AZ2 enter the active state at time point $t_{32}$, and thus the write transistor 23 and the first and second switching transistors 26 and 27 enter the conductive state. Thus, since the reference voltage $V_{ofs}$ is written into the gate electrode of the drive transistor 22, supply of a drive current to the organic EL element 21 from the drive transistor 22 is stopped. As a result, the organic EL element 21 enters an extinction state.

Further, at this time, since the reset signal RS is in the active state and the switch element 101 is in the conductive state, the power supply voltage $V_{ccp}$ is applied to the common line 35. Accordingly, the power supply voltage $V_{ccp}$ is written into the source electrode of the drive transistor 22 by the first switching transistor 26. Further, a power supply voltage $V_{ss}$ is written into the drain electrode of the drive transistor 22 by the second switching transistor 27.

Then, as the reset signal RS enters the active state at time point $t_{33}$, the switch element 101 enters the non-active state, and thus, the application of the power supply voltage $V_{ccp}$ to the common line 35 is released. Further, a period from time point $t_{32}$ to time point $t_{34}$ when the current control signal DS transitions to the non-active state from the active state becomes a period for extinction of the organic EL element 21, resetting of the source electrode $V_s$ and the drain electrode $V_d$ of the drive transistor 22, and preparation of the threshold value correction process.

Then, the current control signal DS enters the non-active state at time point $t_{34}$ while the write scanning signal WS and the first and second control signals AZ1 and AZ2 are in the active state, and the current control transistor 28 enters a non-conductive state, to thereby enter a threshold value correction period. The threshold value correction period becomes a period from time $t_{34}$ to time point $t_{35}$ when the write scanning signal WS transitions to the non-active state.

Then, the voltage of the signal line 33 is switched into the signal voltage $V_{sig}$ of the video signal from the reference voltage $V_{ofs}$ at time point $t_{36}$. As the write scanning signal WS enters the active state again at time point $t_{37}$, and the write transistor 23 enters the conductive state, the signal voltage $V_{sig}$ is imported (written) into the pixel circuit 20B. Further, a period from time point $t_{37}$ to time point $t_{38}$ when the write scanning signal WS transitions to the non-active state is a signal write and mobility correction period. Then, the first control signal AZ1 transitions to the non-active state at time point $t_{39}$, and then the current control signal DS transitions to the active state at time point $t_{40}$.

In addition, as the second control signal AZ2 transitions to the non-active state at time point $t_{41}$, the light emission period of the organic EL element 21 is started. Then, as the reset signal RS enters the active state at time point $t_{42}$, the period of 1 H is terminated. That is, the threshold value correction process and the mobility correction process are executed during the period of 1 H.

While the pixel circuit 20B according to the above-described example 2 has a larger number of components than the pixel circuit 20A according to Example 1, by using the organic EL display device 10 including the pixel circuits 20B, it is possible to obtain the same effects as those of the organic EL display device 10 including the pixel circuits 20A according to Example 1. That is, it is not necessary to prepare a mobility correction pulse of a narrow pulse width for mobility correction, and it is not necessary to form the pulse width adjustment circuit 80 (see FIG. 5) that generates the mobility correction pulse on the display panel 70. Thus, it is possible to shorten the mobility correction period without increasing the circuit size of the peripheral circuits of the pixel array unit 30.

In other words, compared with a case in which the pulse width adjustment circuit 80 is formed on the display panel 70, it is possible to shorten the mobility correction period while reducing the circuit size of the peripheral circuits of the pixel array unit 30. Further, by reducing the circuit size of the peripheral circuits, it is possible to narrow a frame, and accordingly, to minimize the display panel 70. Further, by shortening of the mobility correction period, it is possible to suppress deterioration of uniformity due to turning-on of the organic EL element 21 during the mobility correction period.

<Electronic Device>

The display device according to the above-described present disclosure can be used as any of display units (display devices) of electronic devices in all fields that display video signal input to electronic devices or video signals generated in electronic devices as images or videos. For example, the display device can be used as any of display units of electronic devices such as a television set, a digital camera, a note-type personal computer, a portable terminal apparatus such as a mobile phone, a video camera, and a head mounted display.

In this way, in electronic devices in all fields, by using the display device of the present disclosure as a display unit thereof, the following effects can be obtained. According to the technology of the present disclosure, it is possible to suppress deterioration of uniformity due to turning-on of the organic EL element during a mobility correction period, and thus it is possible to enhance image quality. Further, it is possible to manufacture a small-sized display panel, and thus it is possible to enhance a reasonable yield. Thus, it is possible to reduce the cost of an electronic device including a display unit. In addition, as the display panel becomes smaller, it is possible to achieve miniaturization of a set, and thus it is possible to increase the degree of freedom in design of products (electronic devices).

The display device according to the present disclosure also has a module form configured to be sealed. For example, the module corresponds to a display module formed such that a facing unit such as a transparent glass is attached to a pixel array unit. In the display module, a circuit unit or a flexible printed circuit (FPC) that inputs and outputs signals or the like between the outside and the pixel array unit may be provided. Hereinafter, digital cameras and head mounted displays are exemplified as specific examples of an electronic device using the display device according to the present disclosure. Here, the specific examples exemplified here are merely examples and the present disclosure is not limited thereto.

Specific Example 1

Figure 11A:
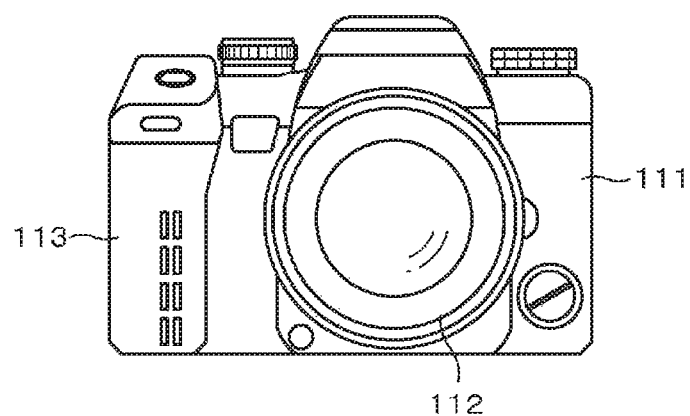
FIG. 11A is a front view thereof and FIG. 11B is a back view thereof.
Figure 11B:
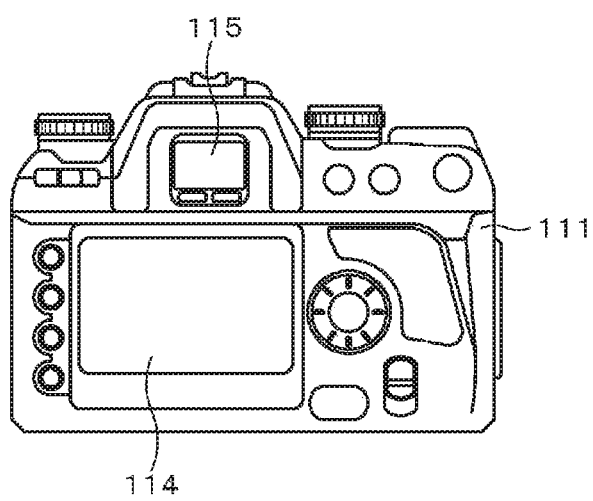

FIG. 11 is an external view of a digital camera of a lens interchangeable single lens reflex type, in which FIG. 11A shows a front view thereof and FIG. 11B shows a back view thereof. The digital camera of the lens interchangeable single lens reflex type includes an interchangeable imaging lens unit (interchangeable lens) on a right front side of a camera main body (camera body) 111, and includes a grip portion 113 for a photographer to grip on a left front side, for example.

Further, a monitor 114 is provided in an approximately central portion of the back of the camera main body 111. A view finder (eyepiece window) 115 is provided above the monitor 114. The photographer looks at the view finder 115, and thus, it is possible to visually recognize a light image of a subject guided from the imaging lens unit 112 and to determine composition.

In the digital camera of the lens interchangeable single lens reflex type with such a configuration, the display device of the present disclosure may be used as the view finder 115. That is, the digital camera of the lens interchangeable single lens reflex type according to the present example is manufactured by using the display device of the present disclosure as the view finder 115.

Specific Example 2

Figure 12:
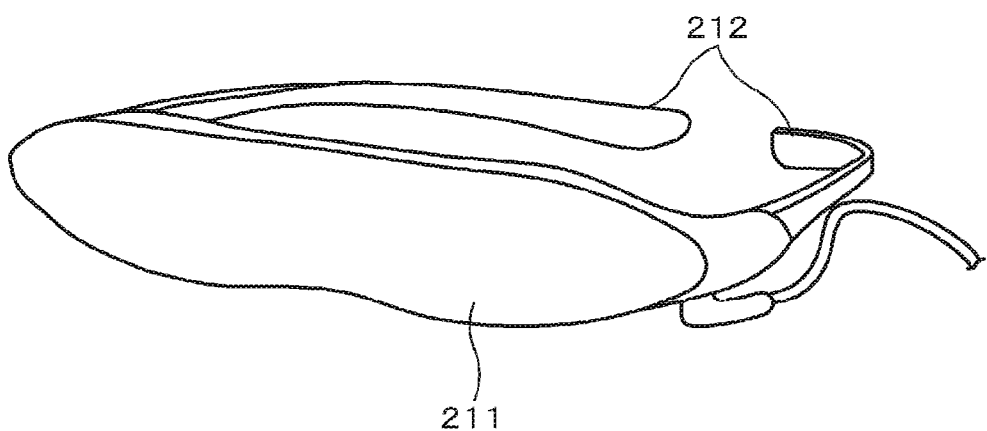
FIG. 12 is an external view of a head mounted display.

FIG. 12 is an external view of a head mounted display. The head mounted display includes hook portions 212 for being mounted on a head portion of a user, on both sides of a spectacle display unit 211, for example. In the head mounted display, the display device of the present disclosure may be used as the display unit 211. That is, the head mounted display according to this example is manufactured by using the display device of the present disclosure as the display unit 211.

Additionally, the present technology may also be configured as below.

[1]

A display device including:

a pixel array unit in which pixel circuits are disposed in a matrix form, the pixel circuits each including a light emission unit, a write transistor that writes a signal voltage of a video signal, a retention capacitor that retains the signal voltage written by the write transistor, and a drive transistor that drives the light emission unit on the basis of the signal voltage retained by the retention capacitor; and a common line that is wired along a pixel row, for each pixel row, wherein the pixel circuit includes a switching transistor which selectively connects the common line and a source electrode of the drive transistor.

[2]

The display device according to [1], including:

a switch element that is provided in a peripheral circuit region of the pixel array unit and selectively applies a predetermined voltage to the common line.

[3]

The display device according to [2], wherein the pixel circuit has a function of a threshold value correction process of changing a source voltage of the drive transistor toward a voltage obtained by subtracting a threshold value voltage of the drive transistor from an initialization voltage of a gate voltage of the drive transistor, with reference to the initialization voltage.

[4]

The display device according to [3], wherein the switching transistor and the switch element enter a conductive state before the threshold value correction process to write a predetermined voltage into the source electrode of the drive transistor.

[5]

The display device according to [4], wherein the switch element enters a non-conductive state after writing of the predetermined voltage and the initial voltage to execute the threshold value correction process.

[6]

The display device according to [5], wherein the pixel circuit has a function of a mobility correction process of applying negative feedback to a potential difference between a gate electrode and the source electrode of the drive transistor by a correction amount corresponding to a current flowing in the drive transistor, to correct a mobility of the drive transistor, and the threshold value correction process and the mobility correction process are executed within 1 horizontal period.

[7]

The display device according to any of [1] to [6], wherein the common line is provided in a state in which the common line overlaps a wire that supplies a fixed voltage to the pixel circuit.

[8]

The display device according to [7], wherein the wire that supplies the fixed voltage is a power supply line that supplies a drive current to the drive transistor.

[9]

The display device according to [7] or [8], wherein the wire that supplies the fixed voltage is a wire that applies a back gate voltage to the drive transistor.

[10]

The display device according to any of [1] to [9], wherein a parasitic capacitor of the common line increases a capacitance value of the entire pixel circuit.

[11]

The display device according to [10], wherein the parasitic capacitor of the common line compensates for a shortage of a capacitance value of an equivalent capacitor of the light emission unit.

[12]

The display device according to [10] or [11], wherein a capacitance value of the parasitic capacitor of the common line is larger than a capacitance value of a parasitic capacitor of the retention capacitor.

[13]

The display device according to any of [1] to [12], including:

a write scanning unit that drives the write transistor; and a control scanning unit that drives the switching transistor, wherein the write scanning unit and the control scanning unit are provided in a peripheral circuit region on the same side with respect to the pixel array unit.

[14]

A method for driving a display device including:
a pixel array unit in which pixel circuits are disposed in a matrix form, the pixel circuits each including a light emission unit, a write transistor that writes a signal voltage of a video signal, a retention capacitor that retains the signal voltage written by the write transistor, and a drive transistor that drives the light emission unit on the basis of the signal voltage retained by the retention capacitor; and
a common line that is wired along a pixel row, for each pixel row,
wherein, in the pixel circuit including a switching transistor which selectively connects the common line and a source electrode of the drive transistor, a capacitance value of a pixel capacitor increases as the switching transistor enters a conductive state.

[15]

An electronic apparatus including
a display device that includes:
  a pixel array unit in which pixel circuits are disposed in a matrix form, the pixel circuits each including a light emission unit, a write transistor that writes a signal voltage of a video signal, a retention capacitor that retains the signal voltage written by the write transistor, and a drive transistor that drives the light emission unit on the basis of the signal voltage retained by the retention capacitor; and
  a common line that is wired along a pixel row, for each pixel row,
wherein the pixel circuit includes a switching transistor which selectively connects the common line and a source electrode of the drive transistor.

REFERENCE SIGNS LIST 10 organic EL display device
20, 20A, 20B unit pixel (pixel/pixel circuit)
21 organic EL element
22 drive transistor
23 write transistor
24 retention capacitor
25 auxiliary capacitor
26 switching transistor (first switching transistor)
27 second switching transistor
28 current control transistor
30 pixel array unit
31 ($31_1$ to $31_m$) scanning lines
32 ($32_1$ to $32_m$) power supply lines
33 ($33_1$ to $33_n$) signal lines,
34 common power supply line
35 ($35_1$ to $35_n$) common lines
36 ($36_1$ to $36_m$) control lines
37 ($37_1$ to $37_m$) back gate lines
37 first control line
38 second control line
40 write scanning line
50 power supply scanning unit
60 signal output unit
70 display panel
71 to 74 input terminal
75, 76 level shift (L/S) circuit
80 pulse width adjustment circuit
81 delay circuit unit
82 gate circuit unit
83 buffer circuit
90 control scanning unit (first control scanning unit)
91 second control scanning unit
92 current control scanning unit
100 reset control unit
101 ($101_1$ to $101_n$) switch elements
102 reset line
$C_p$ common line parasitic capacitor

The invention claimed is:

1. A display device comprising: a pixel array unit in which pixel circuits are disposed in a matrix form, the pixel circuits respectively including a light emission unit, a write transistor that writes a signal voltage of a video signal in response to a first control signal from a first control signal line, a retention capacitor that retains the signal voltage written by the write transistor, and a drive transistor that drives the light emission unit on the basis of the signal voltage retained by the retention capacitor; and a common line that is wired along a pixel column, for each pixel column, wherein the pixel circuit includes a switching transistor which selectively connects the common line and a source electrode of the drive transistor over a period from before a threshold value correction process begins to alter a mobility correction process ends, in response to a second control signal from a second control signal line.

2. The display device according to claim 1, comprising:
a switch element that is provided in a peripheral circuit region of the pixel array unit and selectively applies a predetermined voltage to the common line.

3. The display device according to claim 2,
wherein the threshold value correction process changes a source voltage of the drive transistor toward a voltage obtained by subtracting a threshold value voltage of the drive transistor from an initialization voltage of a gate voltage of the drive transistor, with reference to the initialization voltage.

4. The display device according to claim 3,
wherein the switching transistor and the switch element enter a conductive state before the threshold value correction process to write a predetermined voltage into the source electrode of the drive transistor.

5. The display device according to claim 4,
wherein the switch element enters a non-conductive state after writing of the predetermined voltage and the initial voltage to execute the threshold value correction process.

6. The display device according to claim 5,
wherein the mobility correction process applies negative feedback to a potential difference between a gate electrode and the source electrode of the drive transistor by a correction amount corresponding to a current flowing in the drive transistor, to correct a mobility of the drive transistor, and
the threshold value correction process and the mobility correction process are executed within 1 horizontal period.

7. The display device according to claim 1,
wherein the common line is provided in a state in which the common line overlaps a wire that supplies a fixed voltage to the pixel circuit.

8. The display device according to claim 7,
wherein the wire that supplies the fixed voltage is a power supply line that supplies a drive current to the drive transistor.

9. The display device according to claim 7,
wherein the wire that supplies the fixed voltage is a wire that applies a back gate voltage to the drive transistor.

10. The display device according to claim 1,
wherein a parasitic capacitor of the common line increases a capacitance value of the entire pixel circuit.

11. The display device according to claim 10, wherein the parasitic capacitor of the common line compensates for a shortage of a capacitance value of an equivalent capacitor of the light emission unit.

12. The display device according to claim 10, wherein a capacitance value of the parasitic capacitor of the common line is larger than a capacitance value of a parasitic capacitor of the retention capacitor.

13. The display device according to claim 1, comprising:
a write scanning unit that drives the write transistor; and
a control scanning unit that drives the switching transistor,
wherein the write scanning unit and the control scanning unit are provided in a peripheral circuit region on the same side with respect to the pixel array unit.

14. A method for driving a display device including: a pixel array unit in which pixel circuits are disposed in a matrix form, the pixel circuits respectively including a light emission unit, a write transistor that writes a signal voltage of a video signal in response to a first control signal from a first control signal line, a retention capacitor that retains the signal voltage written by the write transistor, and a drive transistor that drives the light emission unit on the basis of the signal voltage retained by the retention capacitor; and a common line that is wired along a pixel column, for each pixel column, wherein, in the pixel circuit including a switching transistor which selectively connects the common line and a source electrode of the drive transistor over a period from before a threshold value correction process begins to after a mobility correction process ends, in response to a second control signal from a second control signal line, a capacitance value of a pixel capacitor increases as the switching transistor enters a conductive state.

15. An electronic apparatus comprising a display device that includes: a pixel array unit in which pixel circuits are disposed in a matrix form, the pixel circuits respectively including a light emission unit, a write transistor that writes a signal voltage of a video signal in response to a first control signal from a first control signal line, a retention capacitor that retains the signal voltage written by the write transistor, and a drive transistor that drives the light emission unit on the basis of the signal voltage retained by the retention capacitor; and a common line that is wired along a pixel column, for each pixel column, wherein the pixel circuit includes a switching transistor which selectively connects the common line and a source electrode of the drive transistor over a period from before a threshold value correction process begins to after a mobility correction process ends, in response to a second control signal from a second control signal line.

16. The display device according to claim 1, the pixel circuits respectively including an auxiliary capacitor disposed in parallel with the light emission unit.

* * * * *